United States Patent
Newsome et al.

(10) Patent No.: US 7,108,369 B2
(45) Date of Patent: Sep. 19, 2006

(54) INKJET DEPOSITION APPARATUS AND METHOD

(75) Inventors: Christopher Newsome, Cambridge (GB); Takeo Kawase, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 295 days.

(21) Appl. No.: 10/474,942

(22) PCT Filed: Sep. 9, 2002

(86) PCT No.: PCT/GB02/04075

§ 371 (c)(1),
(2), (4) Date: Nov. 19, 2003

(87) PCT Pub. No.: WO03/022581

PCT Pub. Date: Mar. 20, 2003

(65) Prior Publication Data

US 2004/0115344 A1   Jun. 17, 2004

(30) Foreign Application Priority Data

Sep. 10, 2001   (GB) ................... 0121820.5

(51) Int. Cl.
*B41J 2/01* (2006.01)
*B41J 2/155* (2006.01)

(52) U.S. Cl. .................. 347/107; 347/106; 347/102

(58) Field of Classification Search ............... None
See application file for complete search history.

(56) References Cited

U.S. PATENT DOCUMENTS

| | | | | |
|---|---|---|---|---|
| 5,502,476 | A * | 3/1996 | Neal et al. | 347/103 |
| 5,771,054 | A | 6/1998 | Dudek et al. | |
| 6,074,056 | A | 6/2000 | Kubo et al. | |
| 6,120,143 | A | 9/2000 | Narushima et al. | |
| 6,154,232 | A * | 11/2000 | Hickman et al. | 347/40 |
| 6,174,613 | B1 | 1/2001 | Antoniadis et al. | |
| 6,204,871 | B1 | 3/2001 | Keller et al. | |
| 6,209,867 | B1 | 4/2001 | Madsen et al. | |
| 6,270,074 | B1 | 8/2001 | Rasmussen et al. | |
| 6,332,665 | B1 * | 12/2001 | Mantell et al. | 347/37 |

(Continued)

FOREIGN PATENT DOCUMENTS

DE   43 29 338 A1   3/1995

(Continued)

OTHER PUBLICATIONS

Sirringhaus, "High-Resolution Inkjet Printing of All-Polymer Transistor Circuits," SCIENCE, vol. 290, Dec. 15, 2000.

(Continued)

Primary Examiner—Thinh Nguyen
(74) Attorney, Agent, or Firm—Oliff & Berridge, PLC

(57) ABSTRACT

The invention provides a method and apparatus for depositing soluble materials on flexible substrates. The apparatus comprises a drum, which is rotatable about its longitudinal axis, and an inkjet print head disposed over the drum and adapted to be moved relative to the drum in a direction substantially parallel to longitudinal axis of the drum. A substrate is mounted on the drum by vacuum means and a line of droplets of a solution of the selected material is deposited by the print head, which remains stationary as the drum is rotated. The print head is then moved relative to the drum, in the direction substantially parallel to longitudinal axis of the drum, prior to deposition of subsequent lines. In this way, electrical devices can be built up on the substrate and a large scale flexible display device can be fabricated.

108 Claims, 9 Drawing Sheets

U.S. PATENT DOCUMENTS 6,354,700 B1 * 3/2002 Roth .................. 347/103
2001/0003602 A1 6/2001 Fujita

FOREIGN PATENT DOCUMENTS

| EP | 0 011 722 | 6/1980 |
| EP | 0 470 813 A1 | 2/1992 |
| EP | 0 641 648 A1 | 3/1995 |
| EP | 0 949 081 A1 | 10/1999 |
| EP | 1 075 959 A2 | 2/2001 |
| JP | A 55-74884 | 6/1980 |
| WO | WO 95/23244 | 8/1995 |
| WO | WO 99/19900 | 4/1999 |
| WO | WO 01/46987 A2 | 6/2001 |

OTHER PUBLICATIONS

J.C. Sturm et al., "Patterning Approaches and System Power Efficiency Considerations for Organic LED Displays", XP-00098788; SPIE vol. 3476; Jul. 1998; pp. 208-216.

* cited by examiner

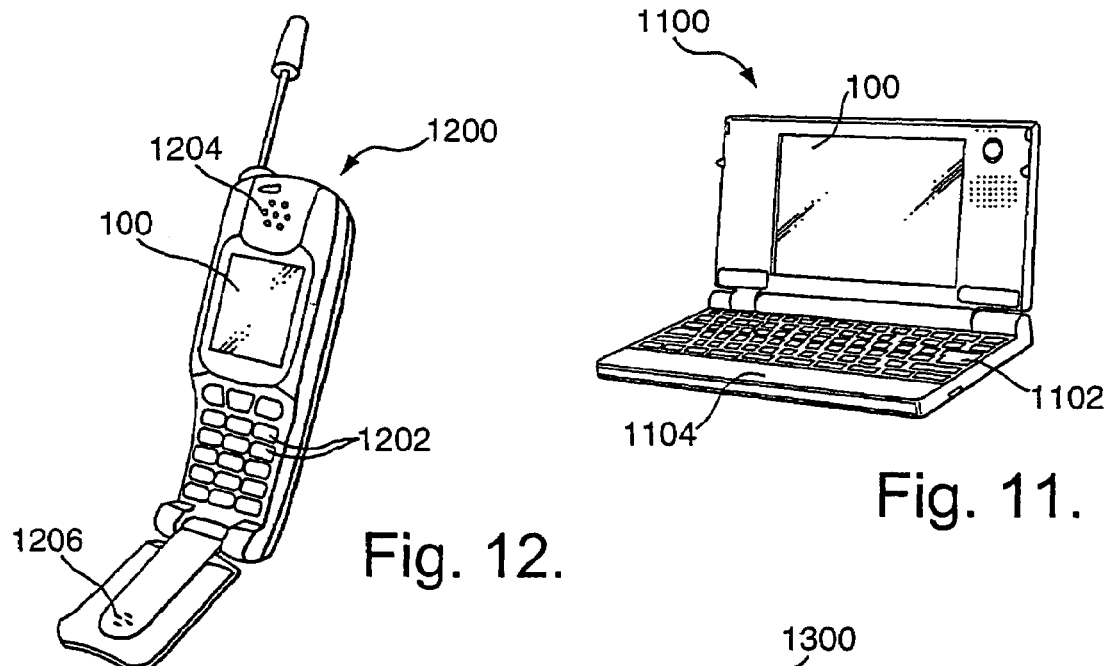
Fig. 11.
Fig. 12.
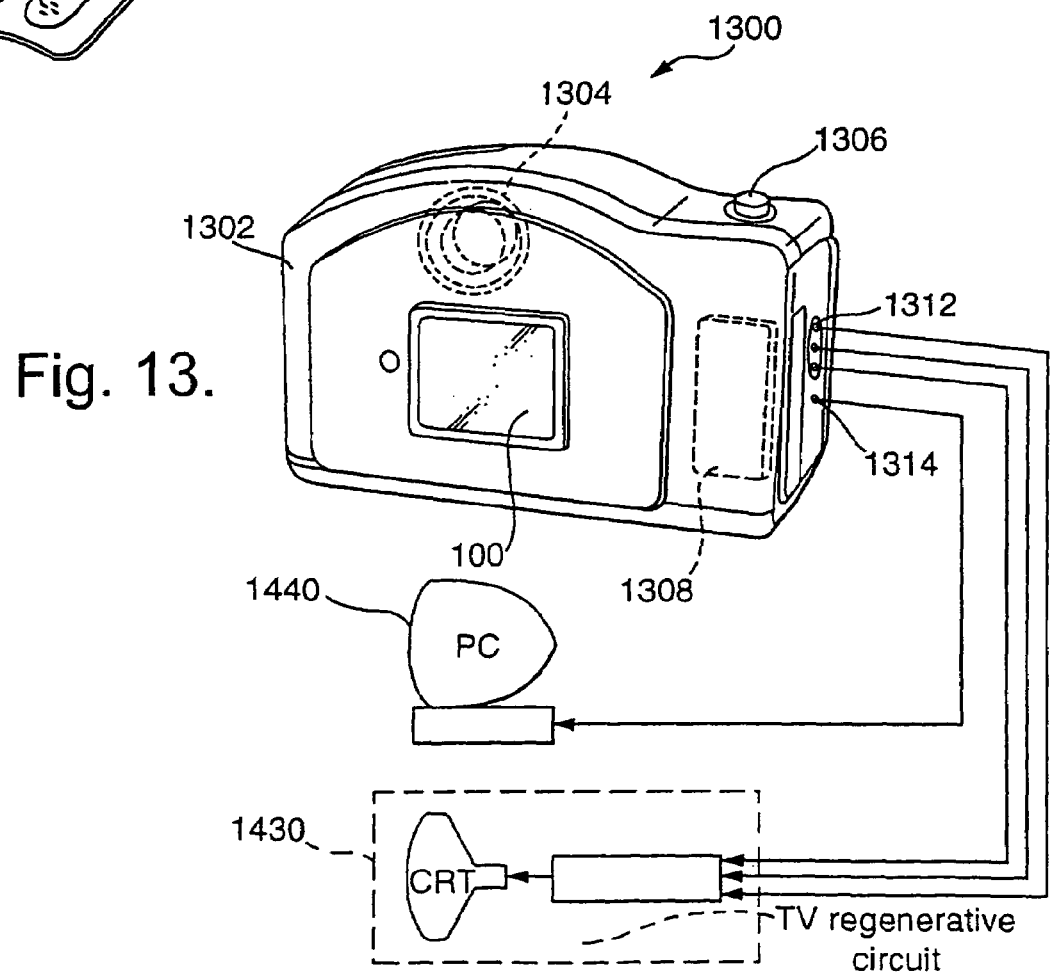
Fig. 13.

INKJET DEPOSITION APPARATUS AND METHOD

The present invention relates to the deposition of soluble materials and in particular to the deposition of soluble materials using inkjet technology on flexible substrates.

In recent years there has been an increase in the number of products which require, as part of their fabrication process, the deposition of organic or inorganic soluble or dispersible materials such as polymers, dyes, colloid materials and the like on solid surfaces. One example of these products is an organic polymer electroluminescent display device. An organic polymer electroluminescent display device requires the deposition of soluble polymers into predefined patterns on a solid substrate in order to provide the light emitting pixels of the display device. Further examples include the deposition of materials for forming organic polymer thin film transistors (TFTs) on a substrate and interconnects between semiconductor chips assembled on the substrate using fluidic self assembly (FSA). The substrate may, for example, be formed of glass, plastics or silicon.

Typically, the substrate is a rigid substrate, thereby providing a rigid display device. However, products comprising flexible displays, which may be rolled or folded, are increasingly sought after, in particular where a large display is required. Such flexible displays provide substantially improved weight and handling characteristics and are less likely to fail due to shock during installation of the display device or use of the display device. In addition, relatively compact display devices comprising a large display area may be conveniently provided.

In the manufacture of semiconductor display devices, including light emitting diode (LED) displays, it has been conventional to use photolithographic techniques. However, photolithographic techniques are relatively complex, time consuming and costly to implement. In addition, photolithographic techniques are not readily suitable for use in the fabrication of display devices incorporating organic polymer materials. Concerns relating to the fabrication of the organic polymer material pixels have, to some extent, hindered the development of products such as electroluminescent display devices incorporating such materials to act as the light emitting pixel elements.

In addition, the use of etch masks, such as photo masks for photolithography or metal shadow masks for patterning by evaporation deposition, is well known in conventional fabrication techniques. Being well known, these processes will not be described in detail in the context of the present invention. However, such conventional fabrication techniques present severe process concerns for a variety of devices including large scale display devices. Indeed, the etching or deposition of relatively long but extremely narrow lines has, for a long period of time, presented severe fabrication difficulties as it is very difficult to produce mechanically robust masks which will provide the required definition in the finished product. For example, a metal shadow mask for evaporation deposition for a large scale display device will inevitably exhibit some sagging or bowing in the central unsupported portion of the mask. This leads to an uneven distance between the mask and the substrate at the edge and the centre of the substrate respectively, thereby giving rise to uneven width and thickness of the deposited lines and adversely affecting the quality of the display.

Consequently, it has been proposed to use inkjet technology to deposit the soluble organic polymers in the fabrication of, for example, electroluminescent display devices. Inkjet technology is, by definition, ideally suited to the deposition of such soluble or dispersible materials. It is a fast and inexpensive technique. In contrast to alternative techniques such as spin coating or vapour deposition, it instantly provides patterning without the need for an etch step in combination with a lithographic technique. However, the deposition of the soluble organic materials onto the solid surface using inkjet technology differs from the conventional use of the technology, to deposit ink on paper, and a number of difficulties are encountered. In particular, there is a primary requirement in a display device for uniformity of light output and uniformity of electrical characteristics. There are also spatial limitations imposed in device fabrication. As such, there is the non-trivial problem to provide very accurate deposition of the soluble polymers onto the substrate from the inkjet print head. This is particularly so for colour displays as respective polymers providing red, green and blue light emissions are required to be deposited at each pixel of the display.

To assist the deposition of the soluble materials it has been proposed to provide the substrate with a layer which includes a pattern of wall structures defined in a material which is de-wetting with respect to the soluble material so as to provide an array of wells or elongate trenches, bounded by the wall structures, for receiving the material to be deposited. Such a patterned substrate will be referred to hereinafter as a bank structure. When organic polymers in solution are deposited into the wells, the difference in the wettability of the organic polymer solutions and the bank structure material causes the solution to self align into the wells provided on the substrate surface.

However, it is still necessary to deposit the droplets of organic polymer material in substantial alignment with the wells in the bank structure. Even when such a bank structure is used, the deposited organic polymer solution adheres to some extent to the walls of the material defining the wells. This causes the central area of each deposited droplet to have, at best, a thin coating of deposited material, perhaps as low as 10% of the material in comparison to the material deposited at the walls of the bank structure. The deposited polymer material at the centre of the wells acts as the active light emissive material in the display device. If the polymer material is not deposited in accurate alignment with the wells, the material will be distributed unevenly, and therefore the amount and thickness of the active light emissive material can be further reduced. This thinning of the active light emissive material is of serious concern because the current passing through the material in use of the display is increased, which reduces the life expectancy and the efficiency of the light emissive devices of the display. This thinning of the deposited polymer material will also vary from pixel to pixel if deposition alignment is not accurately controlled. This gives rise to a variation in the light emission performance of the organic polymer material from pixel to pixel because the LEDs constituted by the organic material are current driven devices and, as stated above, the current passing through the deposited polymer material will increase with any decrease in the thickness of the deposited material.

This performance variation from pixel to pixel gives rise to non-uniformity in the displayed image, which degrades the quality of the displayed image. This degradation of image quality is in addition to the reduction in operating efficiency and working life expectancy of the LEDs of the display. It can be seen therefore that accurate deposition of the polymer materials is essential to provide good image quality and a display device of acceptable efficiency and durability, irrespective of whether a bank structure is provided.

There are two main types of inkjet head. One type uses a thermal print head and these are commonly known as bubble jet heads. The second type uses a piezoelectric print head where a piezoelectric device is located behind a diaphragm in communication with a reservoir. In this second type of inkjet head the piezoelectric device is energised and the diaphragm deflects to pressurise the reservoir, forcing the liquid contained in the reservoir, in this case the polymer material in solution to provide the light emissive pixels for a display, out through a nozzle as a fine droplet of the polymer material. With either type of print head, the nozzle has a very small outlet orifice, typically of a diameter of about 30 microns. The organic polymers are usually dissolved in a relatively volatile organic solvent so that they can be deposited in solution.

During deposition, the inkjet print head is maintained as close as possible to the substrate. Usually, the inkjet print head is arranged at a separation of about 0.5 mm to 1.0 mm above the substrate. However, in inkjet printing the droplets have a flight speed typically in the range of 2 to 10 ms$^{-1}$. The relative speed between the substrate and print head is typically in the range of 0.1 to 1 ms$^{-1}$. Assuming a droplet speed of about 5 ms$^{-1}$ and a separation of 1 mm between the inkjet head and substrate, the time taken for an ejected droplet to reach the substrate is about 0.2 milliseconds. If the print head has a transverse speed of 0.1 ms$^{-1}$ relative to the deposition substrate, an offset of 20 µm will be created between the ejection point and the actual deposition point on the substrate. This offset is regular and equal for all nozzles of the inkjet print head. For conventional printing, in which case the substrate is paper, which is the normal use of this technology, this offset is not problematical because it is the same over the entire printed image and such a small offset in the position of the printed image on the paper is not discernible or problematical to a person viewing the printed image.

However, it will be appreciated that offsets of the order 20 µm are significant when printing electronic, opto-electronic or optical devices on a substrate, when absolute deposition accuracy must be achieved throughout the deposition area. For example, where an organic polymer TFT is to be printed on the substrate it is desirable to maintain a channel length between the source and drain as small as possible, and preferably to less than 20 µm. Similarly, in a colour electroluminescent device, it is necessary to provide a droplet of each of three different organic materials, as well as to deposit electrodes for each droplet, within one pixel area.

Typically, such offsets can be countered by controlling the ejection timing of the print head as it is moved relative to the substrate. However, additional variable offsets may also be introduced, especially when printing on flexible substrates and, in particular, large flexible substrates. Presently, two methods have been proposed for printing flexible substrates.

FIG. 1 shows a conventional inkjet deposition machine 100 for a rigid substrate comprising a base 102 supporting a pair of upright columns 104. The columns 104 support a transverse beam 106 upon which is mounted a carrier 108 supporting an inkjet print head 110. The base 102 also supports a platen 112 upon which may be mounted a substrate 114, which is typically glass and has a maximum size of 40 cm×50 cm. The platen 112 is mounted from the base 102 via a computer controlled motorised support 116 for effecting movement of the platen 112 both in a transverse and a longitudinal direction relative to the inkjet print head, as shown by the axes X and Y in FIG. 1. This motorised support is commonly referred to as a translation stage. As the movement of the platen 112, and hence the substrate 114 relative to the inkjet head 110 is under computer control, arbitrary patterns may be printed onto the substrate by ejecting appropriate materials from the ink-jet head 110. The computer control is further used to control the selection and driving of the nozzles and a camera may be used to view the substrate during printing. To enhance the accuracy of printing, position feedback may be provided for the translation stage, thereby allowing the position of the platen to be continually monitored during motion. In addition, a signal used for communicating between the translation stage and computer control can be used as a clock for timing inkjet ejection.

The first proposed method for inkjet printing of flexible substrates is to provide the flexible substrate on the platen 112 of a conventional inkjet deposition machine. Of course, in the arrangement shown in FIG. 1, the flexible substrate must be supported such that it is planar. However, the manufacture of a sufficiently flat platen is expensive and presents a number of difficulties. These problems are increased in the event that the substrate to be printed is large.

In particular, movement of the platen 112, especially if the platen is for a large flexible substrate, gives rise to considerable momentum and thereby necessitates the provision of a large and usually massive support or base 102. This substantially increases the size of the machine 100. Additionally, the considerable momentum of the platen 112 exacerbates the problem of backlash. Backlash, which is known and problematic even in conventional printing on paper, is caused by reversing the direction of the translation mechanism. This reversal of direction causes an erroneous position of the print head relative to the substrate to be calculated by the control system. Generally, the faster the reversal of direction, the greater the error. Accordingly, in order to calculate the correct relative position, it is necessary for the control system to read encoding marks for the translation mechanism after the direction of printing has been reversed but before printing recommences. Thus, either it becomes impossible to print at the edges of the substrate or the size of the machine is significantly increased.

However, even if encoding marks for the translation mechanism are read after the direction of printing has been reversed, subsequently deposited droplets will not be aligned with droplets deposited while the translation mechanism is moved in the forward direction. This is because the control system calculates the position of the translation mechanism in the reverse direction with respect to a reference point different to that used for the forward direction.

To avoid this problem of asymmetric deposition, droplets may be deposited when the translation mechanism moves in one direction only, so that the control system calculates the position of the translation mechanism with respect to a single reference point. However, again either it becomes impossible to print at one edge of the substrate or the size of the machine is significantly increased compared to a machine in which no encoding marks are read. In addition, depositing droplets in a single direction considerably lowers the deposition speed and reduces efficiency.

Moreover, movement of the platen 112 and the substrate 114 rather than the print head 110 changes the centre of gravity of the translation mechanism thereby acting to tilt the substrate 114 with respect to the stationary print head 110. Thus the distance between the print head 110 and the substrate 114 will vary as the substrate 114 is moved under the print head 110.

Furthermore, at a central portion of the substrate 114, the flight path of a droplet ejected by the print head 110 will be substantially perpendicular to the substrate 114. However, the flight path of a droplet ejected by the print head 110 will be disposed at an angle other than 90° to a peripheral portion of the substrate 114. These variations give rise to an additional variable offset. This variable offset is found to be present even on relatively small substrates. However, as the substrate becomes larger, the offset becomes greater since the translation system becomes longer, giving rise to an increase in the deviation in the flight path of an ejected droplet from perpendicular to the substrate 114.

In an attempt to circumvent these problems, it has been proposed to provide a mechanism for translating the print head 110 along the beam 106 disposed horizontally over the stationary substrate 114. However, the beam 106, being a physical structure, bends very slightly under gravitational forces. Thus, the centre part of the beam 106 will substantially maintain its horizontal disposition so that a droplet deposited with the print head 110 positioned over a central location of the substrate 114 will maintain a flight path perpendicular to the substrate 114. However, as the print head 110 is translated away from this central part of the beam 106, it will no longer be supported truly horizontally over the substrate 114 so the flight path at this second position will no longer be perpendicular to the substrate 114. Hence, if the print head is moved by a distance X along the beam 106, this can give rise to a variation in deposition point of X+α at the substrate 114, where a is the additional variable offset caused by the slight bending of the beam 106. Of course, offset α increases as the distance X increases.

The second proposed method for deposition on flexible substrates is reel to reel printing, in which a web of flexible substrate is wound between and supported by two rollers. In this way, a portion of the substrate may be suspended between the two rollers. This portion is tensioned between the two rollers to reduce the flexibility of the substrate, thereby providing a substantially planar surface for printing. However, tensioning the substrate between the two rollers may introduce uneven stretching of the substrate. Such uneven stretching may be due, for example, to the longitudinal axes of the two rollers not being aligned sufficiently parallel, to one roller being rotated at the incorrect speed relative to the other roller, to variations in the chemical composition of the substrate and to variations in the thickness of the substrate. This effect of uneven stretching can lead to large variable offsets and hence deposition of the soluble material at incorrect locations.

In addition, as the substrate is transferred from the first roller to the second roller during printing, the diameter of the second reel increases as the diameter of the first reel decreases. Thus, correct control of the speed of rotation of the rollers with respect to one another becomes difficult. Furthermore, as the substantially planar portion of the web of flexible substrate is passed under the print head during printing, both the distance and the angle between the print head and the substantially planar portion changes accordingly. This introduces further inaccuracies in the location at which droplets are deposited.

If the substrate is of a relatively large size further irregular offsets may be introduced due to thermal expansion or contraction of the substrate, such as those arising from changes in the ambient conditions in the deposition zone.

Moreover, because the organic polymers are dissolved in a solvent, some evaporation of the solvent can occur as the solution is ejected from the nozzle outlet orifice, so it is common for deposits of the polymer material to form around the inkjet nozzle. These deposits tend to form in an uneven fashion and therefore give rise to an irregular profile for the periphery of the nozzle orifice, causing a deflection of the droplet as it is ejected from the print head nozzle. Because of this deflection, the ejected droplets do not invariably have the same flight angle with respect to the substrate. This gives rise to further, irregular offsets between the desired and actual positions of a droplet deposited on the substrate. Furthermore, the deposits around the nozzle orifice usually vary during the deposition process and the offset between the desired and actual deposition sites can therefore also vary in an irregular manner over the period during which the droplets are deposited. There is, therefore, a significant need to repeatedly monitor the deposition of droplets to ensure that the required accuracy of deposition is being maintained during device fabrication. If deposition accuracy is not being maintained the nozzles of the inkjet head must be cleaned of the deposits. This irregular offset between the position of the inkjet head and the deposition site gives rise to a further concern regarding checking the alignment of the deposited droplets on the substrate.

The inkjet head usually comprises an array of nozzles so that as the head is translated over the deposition area, a number of droplets of the organic polymer or other substance are deposited simultaneously. However, because the build up of deposits is totally random in nature, the irregular offset for a first nozzle of the head may be in one direction (compared to the flight path for the nozzle without any build up of deposit), for example causing the ejected droplet to travel more in the direction of travel of the inkjet head, whilst the deposit at a second nozzle of the head may, for example, cause an offset in a direction opposite to the first direction, i.e. in a direction opposite to the direction of travel of the head. As stated above, there is a regular offset caused by the flight time of a droplet and the speed of movement of the inkjet head. If, for example, the substrate is moving relative to the head, a droplet would actually be deposited to one side of the desired location because the desired location would have moved past the flight path contact point by the time the droplet has traversed the separation gap between the head and the substrate. This is the regular offset referred to above and this can be compensated during initial optical alignment of the head and substrate.

However, in the instance of a droplet ejected by the first nozzle, the regular offset may be cancelled by the irregular offset caused by the deposit on the nozzle. Therefore, viewing of the droplet ejected by the first nozzle may give the impression that there are no alignment concerns because the deposited droplet may appear to be perfectly aligned with its target location, but this is due to the irregular offset, which may vary during the deposition process. However, the irregular offset for the second nozzle is in the opposite direction to that of the first nozzle. Hence, in this second case, the regular and irregular offsets would be cumulative and could provide an unacceptable degree of misalignment between the droplets being ejected from the second nozzle and their target locations. This unacceptable alignment may not be noticed because the alignment check on the first droplet indicates that the inkjet head is properly aligned on the substrate. This is particularly so in the production of relatively large size electroluminescent display devices, because deposition occurs over a longer period of time and there is increased likelihood of variable offsets.

As mentioned above, a pattern of wells of bank material may be used to assist the alignment of the polymer materials. However, polymer material can only be deposited once in each well and the wells ultimately form the active pixels of the display device. Hence, if misalignment does occur to an unacceptable level it is not possible to reposition the ejection nozzle above any particular well of the bank structure and deposit a further droplet of the polymer material. Therefore, if any droplet of deposited polymer material is not in alignment with its respective well, a defective well of polymer material will already have been created on the substrate in the region which ultimately is to provide part of the active area of the final display device, degrading resolution and therefore the displayed image quality.

All of the above offsets may give rise to a variation from the optimum thickness for the organic material in the well in the bank structure, which as stated above, can give rise to non-uniformity in the displayed image and hence, a display of unacceptable image quality. Similar problems occur in respect of arrays of organic thin film transistors and with the provision of interconnects for chips in a devices fabricated using fluidic self-assembly techniques. There is therefore a very significant need to provide an improved fabrication process and apparatus for manufacturing devices using an inkjet printing technique.

According to a first aspect of the present invention, there is provided a method of fabricating an optical, electro-optical, electronic or sensor device, the method comprising: mounting a substrate on and stationary relative to a drum; rotating said drum about a longitudinal axis of said drum; and depositing a series of droplets of a liquid at selected locations on said substrate when said drum rotates.

According to a second aspect of the present invention, there is provided an optical, electro-optical, electronic or sensor device fabrication apparatus comprising: a drum; means for mounting a substrate on and stationary relative to the drum; means for rotating the drum about a longitudinal axis of the drum; and means for depositing a series of droplets of a liquid on the substrate when the drum rotates.

Embodiments of the present invention will now be described by way of further example only and with reference to the accompanying drawings, in which:

FIG. 11 is a schematic view of a mobile personal computer incorporating a display device fabricated in accordance with the present invention;

FIG. 12 is a schematic view of a mobile telephone incorporating a display device fabricated in accordance with the present invention; and FIG. 13 is a schematic view of a digital camera incorporating a display device fabricated in accordance with the present invention.

Figure 2:
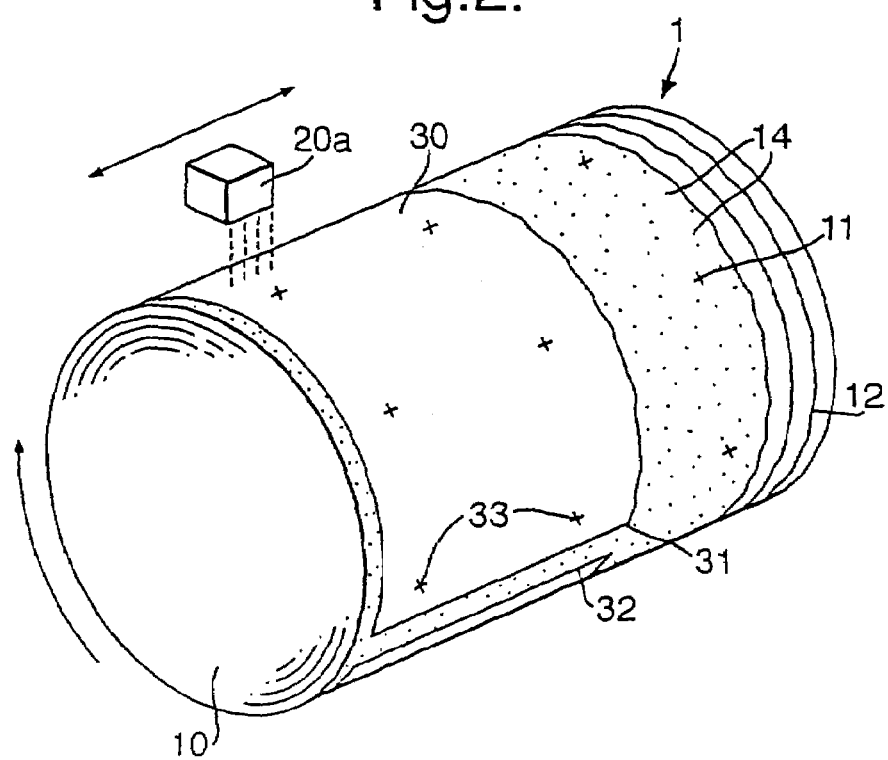
FIG. 2 is a schematic representation an inkjet deposition apparatus according to the present invention.

As shown in FIG. 2, an inkjet deposition machine 1 according to the present invention comprises a drum 10, which acts as the platen for supporting a flexible substrate 30, which may have a surface area of up to 1 $m^2$, or even larger. Only a portion of the substrate 30 is shown in the Figure. Preferably, the drum 10 is cylindrical. The flexible substrate 30 is wrapped around the outer cylindrical surface of the drum 10 and mounted thereon such that it is immovable with respect to the drum 10. Preferably, the cylindrical drum is provided with a plurality of alignment marks 11 thereon and a corresponding plurality of alignment marks 33 is provided on the substrate 30. When the substrate 30 is mounted on the drum 10, the marks 11 provided on the drum 10 are preferably aligned with the marks 33 provided on the substrate 30. This allows correct alignment of the substrate 30 on the drum 10.

For mounting the substrate 30 on the drum 10, a plurality of apertures 14 is provided on the surface of the drum 10 and each aperture 14 is connected to a vacuum suction pump (not shown). In this way, when the substrate 30 is mounted on the drum 10 and the vacuum suction pump is operated, the substrate 30 is held fast to the surface of the drum 10 and is stationary relative to the drum 10. Of course, other means for supporting the substrate 30 on and stationary with respect to the drum 10, including the use of adhesives or a clamping mechanism, will be apparent to those skilled in the art.

Figure 5:
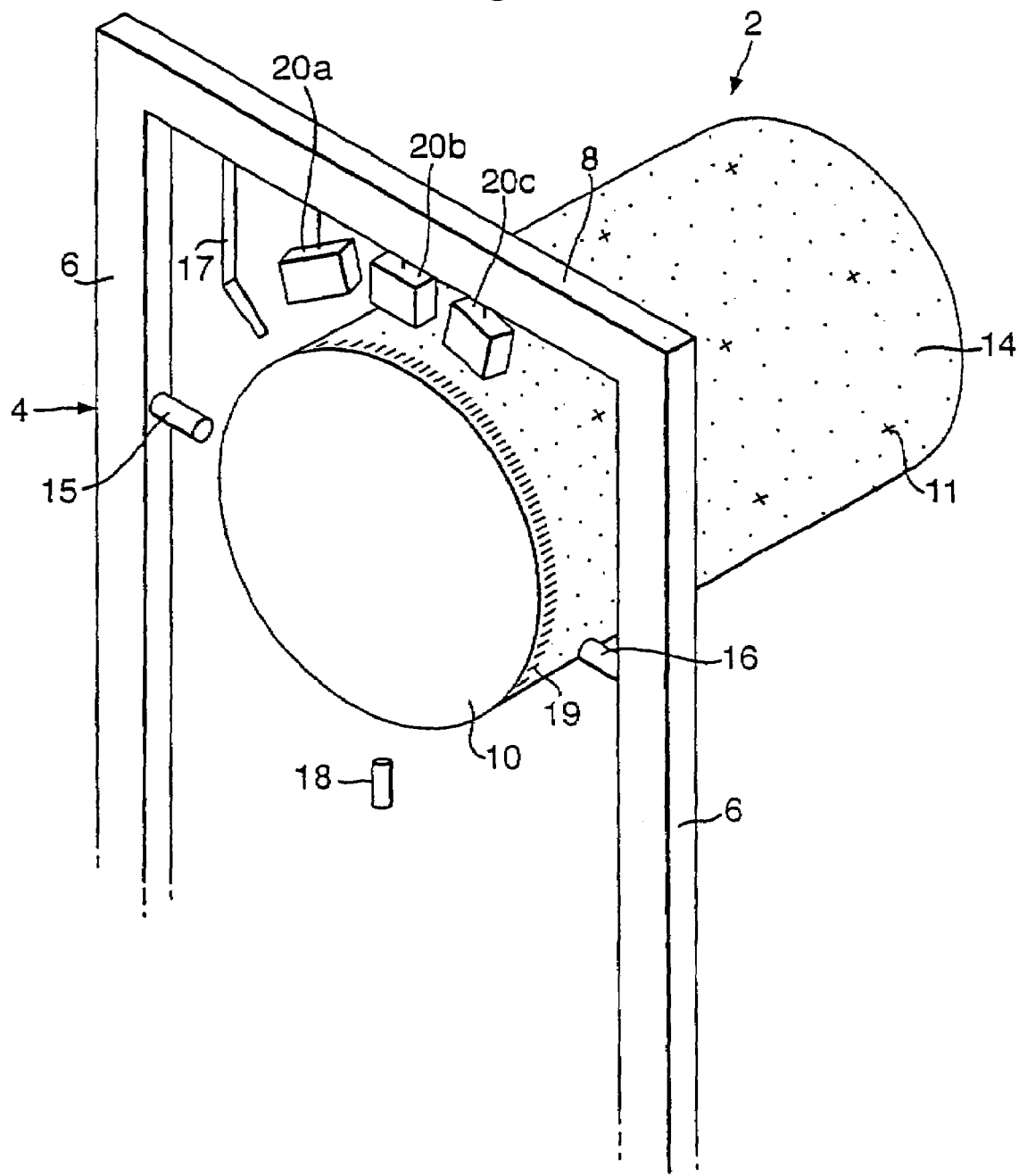
FIG. 5 is a schematic representation of another inkjet deposition apparatus according to present invention.

Although not shown, the drum 10 is mounted, for example on an axle running along its longitudinal axis, in such a way that it can be rotated by a motor about its longitudinal axis. The motor is computer controlled using a position feedback system for control of the speed of rotation of the drum 10. Additionally, the absolute angular position of the drum 10 may be monitored. Such control may be implemented, for example, by reading encoding marks 19 provided on the drum 10, as shown in FIG. 5, or on the axle. Various alternatives for monitoring angular position will be evident to persons skilled in the art.

An inkjet print head 20a is disposed over the drum 10 and the print head 20a and the drum 10 are supported in such a way that they can be moved relative to one another in a direction substantially parallel to the longitudinal axis of the drum 10. As the drum 10 and the substrate 30 supported thereon are rotated, the inkjet print head 20a is controlled to deposit droplets of soluble organic material at selected and appropriate locations on the substrate 30. Preferably, control of the print head 20a is performed by clocking ejection timing of droplets in accordance with the position or velocity of the rotating drum 10. This velocity and hence the position of the drum 10 are known from the position feedback system briefly described above.

Figure 3A:
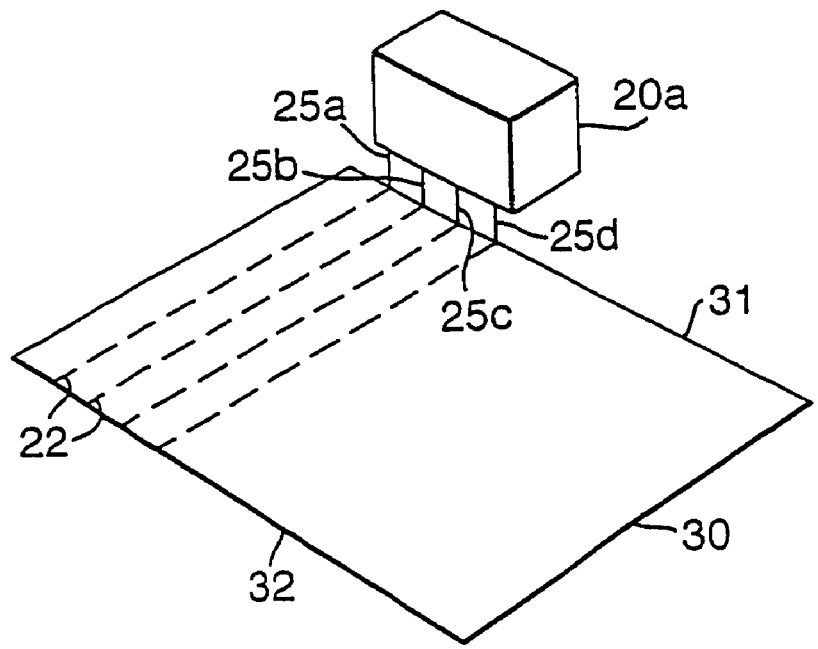
FIGS. 3A and 3B show schematically the printing of a substrate using one print head according to the present invention.

The substrate 30, which is most commonly substantially square or rectangular, may be mounted on the drum 10 in such a way that two opposite edges 31 and 32 of the substrate 30 are substantially parallel with one another and with the longitudinal axis of the drum 10, as shown in FIG. 2. In this case, the print head 20a may be maintained stationary during one revolution of the drum 10. Thus, as shown in FIG. 3A, the nozzles 25a–d of the print head 20a will deposit respective columns 22 of droplets (each column being shown as a dashed line) for one revolution of the drum 10, each column 22 running perpendicular to edges 31 and 32 of the substrate 30. Subsequently, the print head 20a is moved a distance in the direction of the longitudinal axis of the drum and subsequent respective columns 24 of droplets are deposited (each subsequent column being shown as a solid line in FIG. 3B).

Figure 3B:
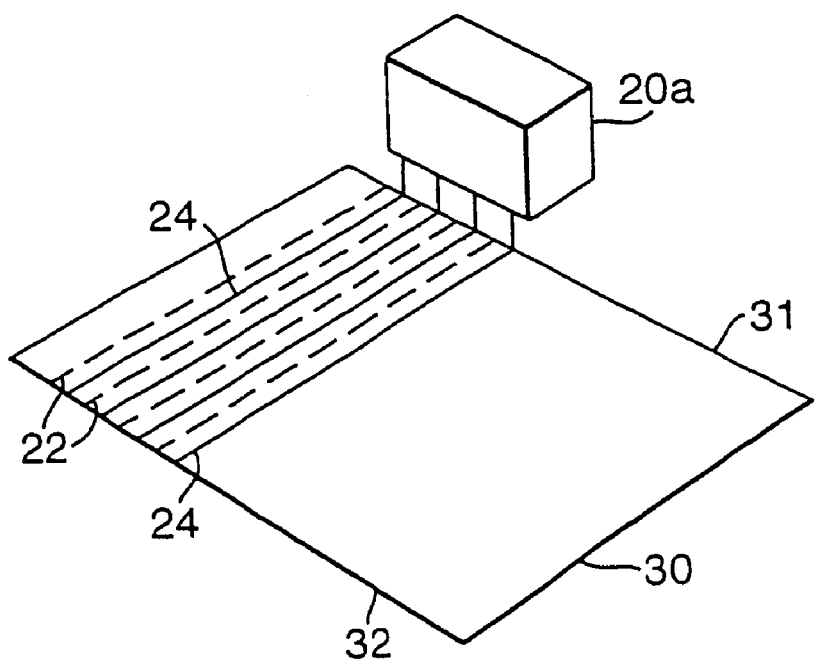

However, as discussed above, a high resolution of droplets is often required, for example to obtain a short channel length in an organic thin film transistor. Such a high resolution is not at present obtainable in a print head 20a having a plurality of nozzles 25a–d, since the nozzles 25a–d are spaced apart further than the required distance between deposited droplets. Accordingly, the print head 20a may be moved in the direction of the longitudinal axis of the drum 10 by only the distance necessary to obtain the required resolution. In this way, as shown in FIG. 3B, the second plurality of deposited columns 24 is interleaved with the first columns 22. Subsequently, third and further pluralities of columns may also be deposited interleaved with the first and second columns 22 and 24, depending on the distance between the nozzles 25a–d, the number of nozzles on the print head 20a and the resolution required in the device being manufactured.

Preferably, the drum 10 is rotated continuously in one direction during deposition of the first and subsequent columns such that one or more columns of droplets is deposited during a revolution of the drum 10. Thus, after each column of droplets has been deposited, rotation of the drum 10 is maintained. If the width of the substrate 30 between edges 31 and 32 is the same as or only very slightly less than the circumference of the drum 10, then after the first columns 22 of droplets have been deposited during a first revolution of the drum, the print head 20a may be moved in the direction of the longitudinal axis of the drum 10 during a subsequent second revolution of the drum 10 without deposition of droplets. In this way, at the beginning of the third revolution, the print head 20a is disposed at the correct longitudinal position over the substrate 30 and deposition of the droplets may be performed at the extreme edges of the substrate. Previously, accurate deposition of droplets at the extreme edges of a substrate, particularly a substrate for a large scale display device, was not possible since registration of the position of the edges of such substrates with respect to print heads is generally erroneous in prior art inkjet deposition apparatuses. Such erroneous position registration occurs in prior art inkjet deposition apparatuses for the reasons discussed above, including backlash as the direction of travel of the substrate or the print head is reversed. Accordingly, the apparatus of the present invention provides a very significant advantage over such prior art inkjet deposition apparatuses. Of course, depending on the speed of rotation of the drum 10 and the distance that the print head 20a must be moved, it is also possible to step the print head 20a after deposition of the first columns 22 such that it is disposed at the correct longitudinal position over the substrate 30 in time to deposit the second columns 24 during the next revolution of the drum.

Additionally, if the width of the substrate between edges 31 and 32 is made less than the circumference of the drum 10, then further improvements in the rate of deposition can be obtained. This is because the print head 20a may be moved in the longitudinal direction of the drum during the period in which a gap between the edges 31 and 32 is disposed underneath the print head 20a while the drum 10 is still rotating. Thus, the print head 20a is moved during the first revolution, immediately after printing of the first columns 22, when deposition of droplets on the substrate 30 is not possible. In this way, the print head 20a is disposed at the correct location over the substrate at the beginning of the second revolution of the drum 10 and so the second columns can be deposited during the second revolution of the drum 10 and so forth.

In addition, since the drum 10 is rotated about its longitudinal axis, the centre of gravity of the drum 10 does not change. Thus, the distance between the print head 20a and the drum 10 and the angle therebetween is maintained constant throughout the deposition of a column. This not only allows the problems associated with the change in the centre of the gravity that occur in prior art inkjet deposition apparatuses to be avoided, but also allows the drum to be rotated at high speeds, allowing considerably increased deposition rates, higher manufacturing throughput and lower costs. Since the volume of the deposited droplets is small, the surface energies of the droplets and the substrate 30 respectively are the dominant forces affecting the droplet. Thus, deposited droplets are not displaced by rotation of the drum. Accordingly, deposition rates of 10 $ms^{-1}$ or greater can be achieved.

Figure 1:
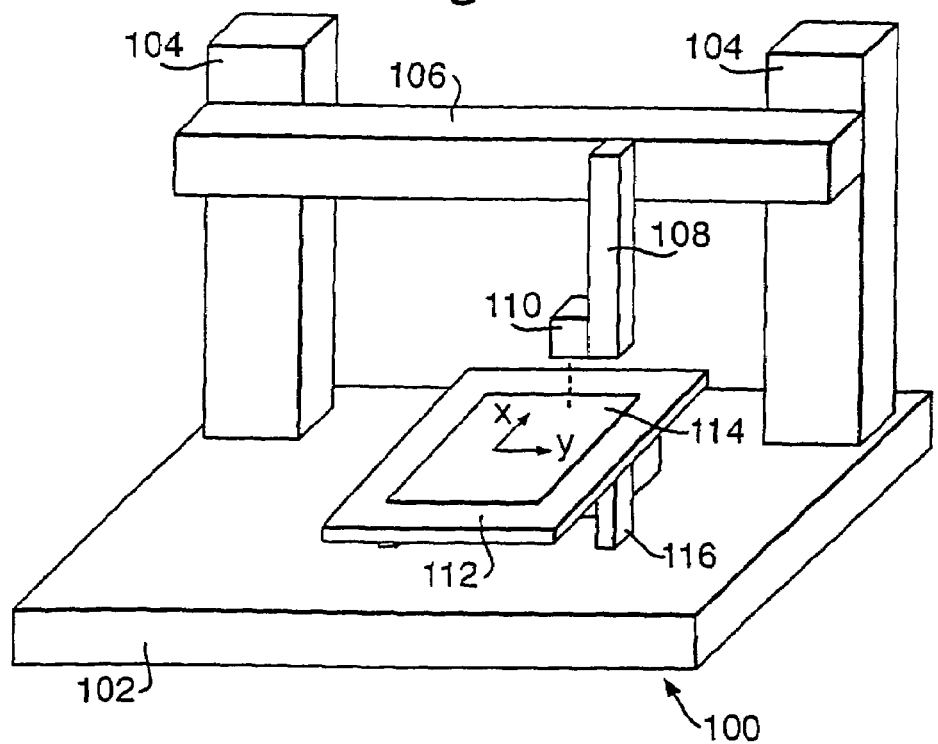
FIG. 1 is a schematic representation of a prior art inkjet deposition apparatus.

As discussed above, the material being ejected from the print head may build up on the nozzles, causing an irregular offset. In prior art apparatuses, such as that shown in FIG. 1, the nozzles may be flushed at regular intervals. Prior to flushing, the print head 110 and substrate 114 are moved relative to one another so that the print head 110 is not disposed over the substrate 114. The print head 110 is then flushed, for example by expelling the solution of the material being deposited on the substrate 114, thereby removing the build-up. However, the need to move the substrate 114 away from the print head 110 introduces additional backlash, may result in a loss of positioning accuracy and takes time, resulting in a loss of efficiency, and has the disadvantage that the size of the apparatus 100 must be increased. Accordingly, flushing of the nozzles during a deposition process is avoided in prior art inkjet deposition methods.

A further advantage of the above arrangement of the present invention, in which there is a gap between edges 31 and 32, is that the nozzles 25a–d may be flushed when the print head 20a is disposed above the gap. This allows the irregular offset caused by material build-up to be minimised without either contaminating the substrate 30 or making an additional movement of the print head 20a relative to the substrate 30. Thus, the size of the apparatus 1 can be minimised. Furthermore, no time is wasted and no positioning errors or backlash are introduced by moving the substrate 30 away from the print head 20a. If required, means may be provided in the drum 10 for capturing and recycling the fluid used for flushing the print head 20a.

Figure 6:
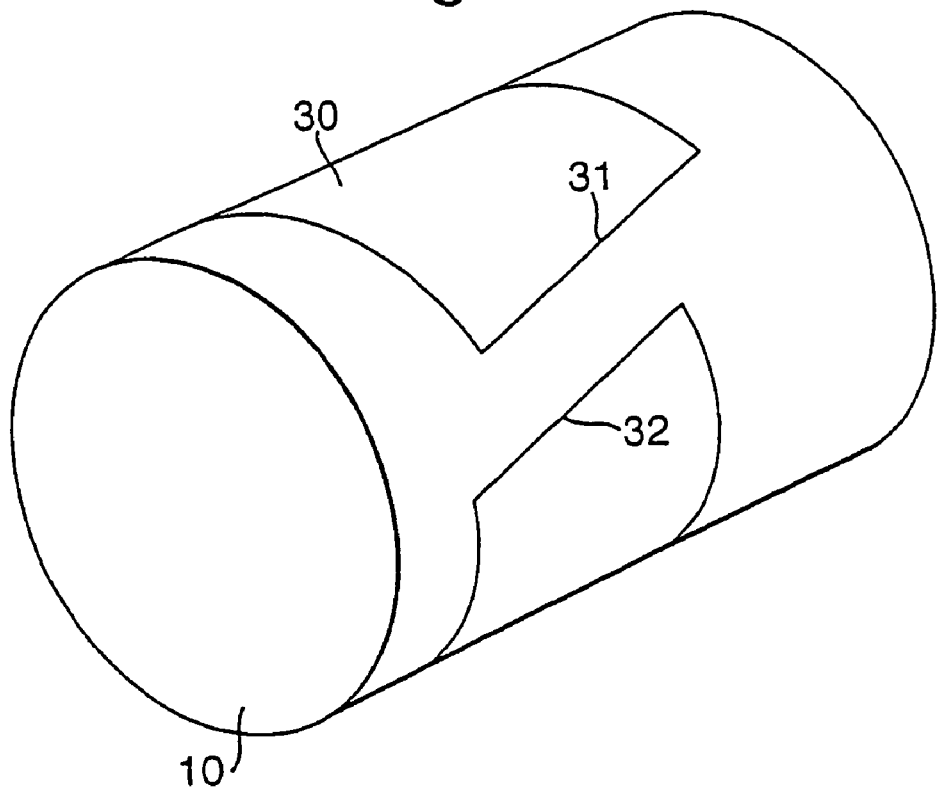
FIG. 6 is a schematic representation of an alternative arrangement of a substrate on an inkjet deposition apparatus according to the present invention.

Another alternative arrangement, forming part of the present invention, is to mount the substrate 30 at an angle on the drum 10, such that edges 31 and 32 are parallel with one another but at an angle to the longitudinal axis of the drum 10. Such an arrangement is schematically shown in FIG. 6, for the purposes of illustration only. With such an arrangement, both the print head 20a and the drum 10 are preferably moved continuously during deposition of droplets on the substrate 30. Preferably, the substrate 30 is mounted on the drum 10 such that the end of a first column 22, deposited during a first revolution of the drum, is aligned along the same line as the beginning of a second column 24, deposited during a second subsequent revolution. As such, columns deposited during successive revolutions of the drum lie along the same helical line running around the circumference of the drum 10. Thus, the print head 20a is moved in the direction of the longitudinal axis during deposition itself in order to maintain columns running substantially perpendicular to the edges 31 and 32 of the substrate 30. This has the advantage that no positioning errors result from stopping and starting movement of the print head 20a. Moreover, it is possible to achieve printing of columns for each revolution of the drum 10, irrespective of whether the size of the substrate 30 is selected such that there is a gap between edges 31 and 32, thereby resulting in improved deposition rates.

It will therefore be immediately apparent to persons skilled in the art that the present invention provides a number of significant advantages over the prior art. Firstly, as will be obvious to those skilled in the art, it is considerably easier to provide a cylindrical drum 10 having a substantially circular cross section than it is to provide a platen 112 having a substantially flat surface. In addition, the cylindrical drum 10 of the present invention has considerably greater rigidity than a prior art planar platen 112 and is therefore not subject to bowing. As such, the drum 10 of the present invention is lighter, cheaper and easier to control than the platen 112 of prior art apparatuses. This allows the production of considerably larger flexible substrates than has hitherto been possible.

Although the print head 20a is preferably provided on a movable support for movement along the drum 10, it will be understood that the drum 10 may instead be provided on a support movable in the direction of the longitudinal axis. Alternatively, both the drum 10 and the print head 20a may be provided on movable supports. However, irrespective of these considerations, the massive support required for prior art apparatuses is not required for the apparatus 1 of the present invention. The apparatus 1 of the present invention is therefore smaller, cheaper and easier to manufacture and maintain than prior art apparatuses.

Moreover, because the drum 10 is constantly rotated in one direction only, the problems of backlash and a reverse in the direction of offset due to a change in direction of movement of the print head 110 with respect to the prior art platen 112 are avoided in the present invention. Thus, deposition using an apparatus 1 according to the present invention is more accurate than using a prior art inkjet deposition apparatus. This allows the production of improved performance, higher resolution devices and reduces wastage due to inaccuracy of deposition.

What is more, the feature of rotating the drum 10 in only one direction also allows considerably improved deposition speeds, without an adverse effect on the accuracy of deposition. Moreover, the apparatus 1 of the present invention requires far less space than prior art apparatuses. This is apparent from the fact that a drum of the same surface area as a platen has a significantly smaller diameter than the width of the platen.

Figure 4A:
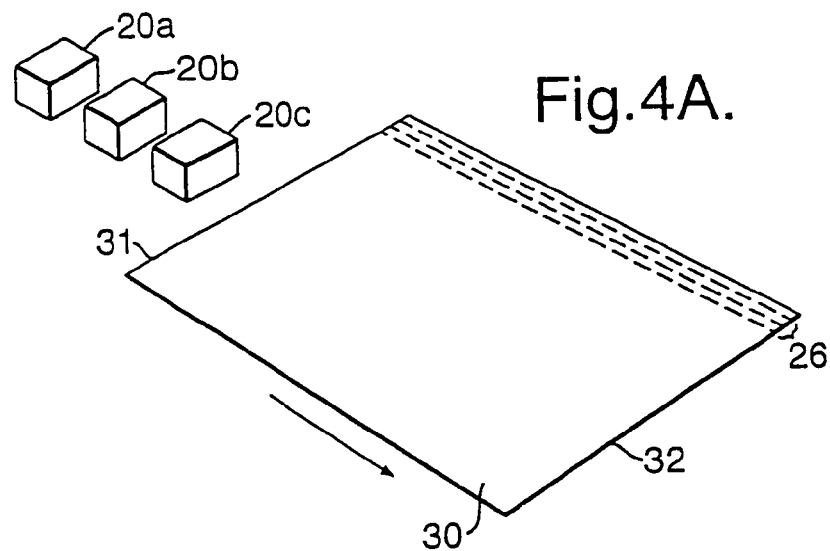
FIGS. 4A, 4B and 4C illustrate schematically the printing of a substrate using three print heads according to the present invention.
Figure 4B:
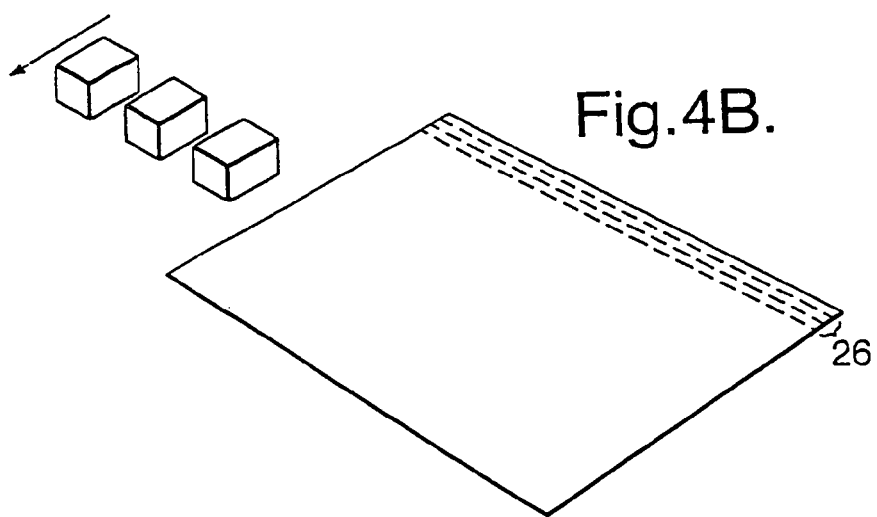
Figure 4C:
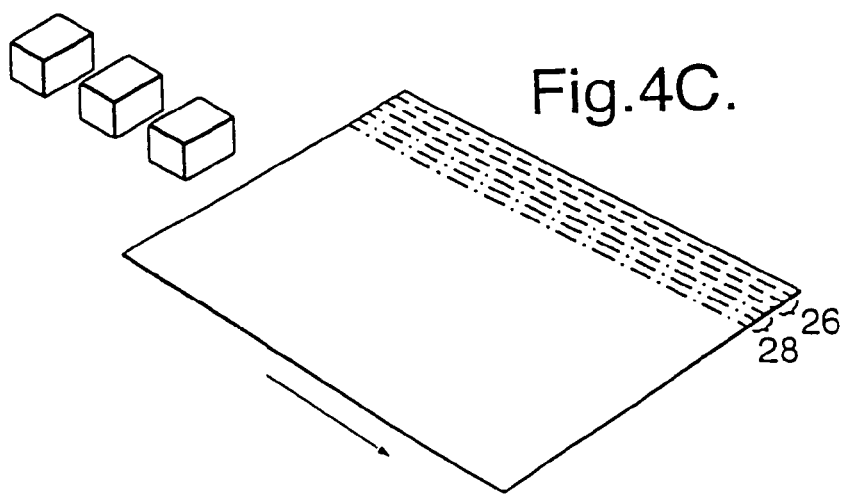

Of course, more than one print head may be disposed over the drum. FIGS. 4A–C show the case where three print heads 20a–c are disposed over the drum. In the example shown in FIGS. 4A–C, each print head 20a–c has a single nozzle and may be used to deposit the same material on the substrate 30. Further, as shown in these figures, the print heads may be staggered, such that they are disposed at different distances along the length of the drum. Thus, as the drum 10 is rotated a first revolution, each print head 20a–c deposits a first column 26 (shown as a dashed line) of material on the substrate 30, each of the columns being parallel as shown in FIG. 4A. Each of the print heads 20a–c is then moved relative to the drum 10 in the direction of the longitudinal axis thereof, as illustrated in FIG. 4B. During a subsequent revolution of the drum 10, each print head 20a–c then deposits a second column 28 of material on the substrate, shown as dashed-dotted lines in FIG. 4C.

FIGS. 4A–C show the case where each print head 20a–c has a single nozzle and there is no interleaving between first and second columns 26 and 28. However, any one or more of the print heads 20a–c may have a plurality of nozzles and may be moved relative to the drum 10 such that the plurality of first columns 26 deposited by each the nozzles of one of the print heads 20a–c is interleaved with the plurality of second columns 28 deposited by the nozzles of the same print head or by the nozzle or nozzles of another of the print heads 20a–c.

The apparatus 1 of the present invention allows the incorporation of a number of different processes required for the fabrication of the device to be manufactured. Such processes include the patterning of the substrate 30 itself, for example to produce a plurality of bank structures as discussed, or the patterning of the material deposited on the substrate.

Thus, in the case that more than one print head is used, one or more of the print heads may be adapted to deposit a material different to another of the print heads. Similarly, different nozzles of the same print head may be adapted to deposit different materials. Accordingly, in the example illustrated in FIG. 4, print head 20a could be used to deposit a first material on the substrate 30, such as an etchant for etching the substrate. After etching, the etchant could be removed. Print head 20b could then be used to deposit a second material on the etched substrate and print head 20c could be used to deposit yet another material over both the substrate and the second material during the next revolution of the drum 10. In this way, each of the components of, for example, an organic polymer thin film transistor could be deposited on the substrate 30. Similarly, each of the three print heads 20a–c could be adapted to deposit a different one of the three electroluminescent materials required for a three colour electroluminescent display device. Of course, more than three print heads can be provided in the apparatus and more than three different materials can be deposited. Moreover, it is not necessary to stagger the print heads 20a–c. Rather, each of the print heads 20a–c could be provided in a straight line either orthogonal or parallel to the longitudinal axis of the drum 10.

FIG. 5 shows schematically an example of an apparatus 2 according to the present invention in which further processing steps are provided. In this example, the apparatus 2 includes a drum 10 for supporting a substrate 30 and a gantry 4. The gantry 4 comprises a pair of upright columns 6 and a transverse beam 8, on which three print heads 20a–c are provided such that they are disposed above the upper surface of the drum 10. Because the drum 10 has a smaller diameter than the width of a prior art flat platen 112 of the same surface area, the transverse beam 6 is shorter than an equivalent prior art transverse beam 106 (shown in FIG. 1) and is therefore less subject to bowing.

As shown in FIG. 5, the print heads may be disposed on the transverse beam 8 in a line substantially orthogonal to the longitudinal axis of the drum 10. Thus, print head 20c may deposit a first material on the substrate 30 and, during the same or a subsequent revolution of the drum 10, print head 20b may deposit the same or a different material on the material deposited by print head 20c. Alternatively, the print heads 20 may be staggered, substantially as schematically illustrated in FIGS. 4A–C. As a further alternative, they may be disposed in a line substantially parallel to the longitudinal axis of the drum 10. Depending on the arrangement, number and size of the print heads 20 and the size of the drum 10, the print heads 20 may be angled with respect to the drum 10 as necessary, such that the longitudinal axis of the nozzles of each print head 20 is substantially perpendicular to the surface of the drum 10.

The rotatable drum 10 may be provided on a movable support, such that it can be moved along its longitudinal axis relative to the stationary gantry 4. However, the support for the rotatable drum 10 is preferably immovable in the direction of the longitudinal axis and the gantry 4 is instead adapted to be moved in this direction. Because the print heads 20 are fixed on the transverse beam 8 and are not moved therealong, the problem associated with some prior art inkjet apparatuses, of offset in the droplets deposited on the substrate, is avoided. This is because the angle of the flight path of a deposited droplet with respect to the substrate 30 does not vary depending on the location of the respective print head nozzle 25. Moreover, as discussed above, the contrary problem of a change in the centre of gravity of the platen 112 is also avoided. Thus, a substantially constant flight path may be maintained irrespective of the position of the nozzle over the substrate.

The apparatus 2 of this example further comprises a reader 18 for reading the encoding marks 19 provided on the drum 10. The reader 18 is stationary in the longitudinal direction relative to the drum 10 so that the encoding marks 19 need only be provided on one circumferential portion of the drum 10. Of course, the encoding marks 19 may also be provided on the rotating axle (not shown) of the drum 10 or elsewhere in the drive system and the reader 18 disposed accordingly. This enables feedback control for controlling the motor (not shown) to obtain the required angular position and speed of the drum 10 and the appropriate ejection timing for each of the nozzles of each of the print heads 20.

In addition, a gas stream may be supplied by means of a gas jet 17 for speeding up drying of deposited droplets. The gas jet may be provided in addition to or instead of the heating filaments 12 provided in the drum 10 and may be disposed on the gantry 4, for example on the transverse beam 8, adjacent the print heads. Typically, the gas is nitrogen or an inert gas. Since only very small droplets are deposited, for example having a volume of as little as 5 picolitres, the droplets can be dried very quickly by means of the gas jet 17 and/or the heating filaments 12. This allows subsequent deposition on or patterning of the material deposited by a first one of the print heads 20a by a second of the print heads 20b almost immediately.

The use of a gas jet has been proposed in the prior art. However, as discussed above, the direction of movement of the print heads with respect to the substrate is changed during printing in prior art apparatuses. This has necessitated a gas jet to be disposed on either side of a print head in prior art apparatuses, such that the gas is passed over the deposited material immediately after each droplet is deposited to rapid drying. One proposed solution to this problem is to provide a single angled gas jet such that gas is passed over the deposited droplet irrespective of the direction of travel of the print head. However, this has the disadvantage of blowing the droplet off course in the time it travels from the nozzle to the substrate and even blowing the droplet to a different position on the substrate after deposition, thereby creating an additional offset. This problem is further exacerbated by the reciprocating motion of the print head with respect to the substrate during printing and the fact that the additional offset is in one direction only. In contrast, in the present invention, since the substrate 30 is moved in one direction only during deposition, it is possible to provide only a single gas jet 17 adjacent the print heads 20, preferably disposed substantially perpendicular to the substrate 30, without affecting the flight path of deposited droplets. Thus, the prior art problems are avoided by the present invention. Of course, a gas jet 17 may be provided for each of the print heads if required.

A charge coupled device (CCD) camera 16 may also be provided on the gantry 4, for example on one of the upright columns 6. The CCD camera 16 may be used to view the alignment marks 11 provided on both the drum 10 and the substrate 30. Thus, it is possible to check both before and during deposition that the substrate 30 is correctly positioned on the drum and that droplets are deposited at the correct positions on the substrate, via the reader 18 and subsequent control of the ejection timing. Thus, each of the alignment marks 11 and 33 on the substrate 30 and the drum 10 respectively can be scanned before deposition and a virtual map of the substrate 10 can be created, indicating the position of the substrate 30 on the drum. The position and the ejection timing of the print heads 20 can then be adjusted accordingly so that droplets are deposited at the correct locations.

Alternatively, the alignment marks 33 may be provided on the substrate 30 only and not on the drum. Thus, the substrate may be scanned prior to deposition to create a virtual map of the substrate 30, with reference only to the encoding marks 19 on the drum 10, and the position and the ejection timing of the print heads 20 can be adjusted with reference to the map.

However, the alignment marks 11 on the substrate 30 will preferably be positioned precisely over the alignment marks provided on the drum 10. Hence, in the event that the substrate 30 has not been precisely positioned on the drum 10, the virtual map may also be used to determine this incorrect positioning and to adjust ejection timing accordingly. Such a virtual map also indicates any stretching of the substrate 30, for example where only some of the alignment marks 11 of the substrate 30 are positioned precisely over those provided on the drum 10 but others are not. The ejection timing can be adjusted accordingly, to account for such discrepancies.

Although all processing steps are preferably carried out on the substrate 30 without removing it from the drum 10, this feature is of particular advantage in fabrication methods where the substrate 30 is removed from and then replaced on the drum 10 during processing. For example, a first process step for depositing a first material on the substrate may be performed using the apparatus of the present invention. Subsequently, the substrate 30 may be removed from the drum 10 for a subsequent second process step, for example spin coating an insulating layer on the substrate. Finally, the substrate 30 may then be repositioned on the drum 10 for depositing a third material. In such a case, a virtual map may be created before both the first and third materials are deposited and the two maps subsequently compared. If, for example, the first deposited material forms the source and drain of an organic thin film transistor and the third deposited material forms the gate of the transistor, the creation of the virtual maps allows the gate to be deposited precisely over the channel between the source and drain.

The CCD camera 16 may also be used to scan either or both of the alignment marks 11 and 33 and already deposited droplets during the deposition process, thereby allowing appropriate adjustment of the ejection timing to allow for detected inaccuracies. Furthermore, where a bank structure is provided on the substrate 30, the same or a further CCD camera 16 may be used to check the accuracy of deposition of droplets in each of the wells of the bank structure. As discussed above, a build up of material on the nozzles may cause a random, irregular offset by changing the trajectory of the droplets deposited from the respective nozzles. Such irregular offsets can be detected by the CCD camera for each of the nozzles and their ejection timing can be appropriately adjusted to compensate for the irregular offsets. This is of particular benefit where the print heads 20 are not flushed during deposition.

In addition, it has been found that it is preferable to inspect droplets deposited in the wells of a bank structure while they are still wet. In this instance, the term "wet" includes any state of a droplet other than dry and specifically includes, for example, a tacky state before the droplet has dried completely. However, due to the small size of the droplets and the provision of a gas jet 17 and/or heating filaments 12, the droplets have been found to dry before they can be inspected. In order to avoid this problem, the drum 10 can be made hollow and transparent to the CCD camera 16 and the CCD camera 16 may be disposed inside the drum 10. Thus, where the substrate 30 is a similarly transparent substrate, both the alignment marks 11 and 33 and the deposited droplets may be inspected from inside the drum. This has the advantage that the droplets may be inspected immediately after deposition, while still wet, and that their position on the substrate 30 can be more accurately established. Better control and adjustment of the ejection timing can therefore be achieved.

The apparatus 2 may further comprise a laser 15 for patterning the substrate 30. The laser 15 may be used, for example, in the patterning of a bank structure on the substrate 30. The laser may also be used to expose a photosensitive material in order to create a contrast in the wetting properties, thereby aiding the alignment of the material deposited by the inkjet heads.

Figure 7:
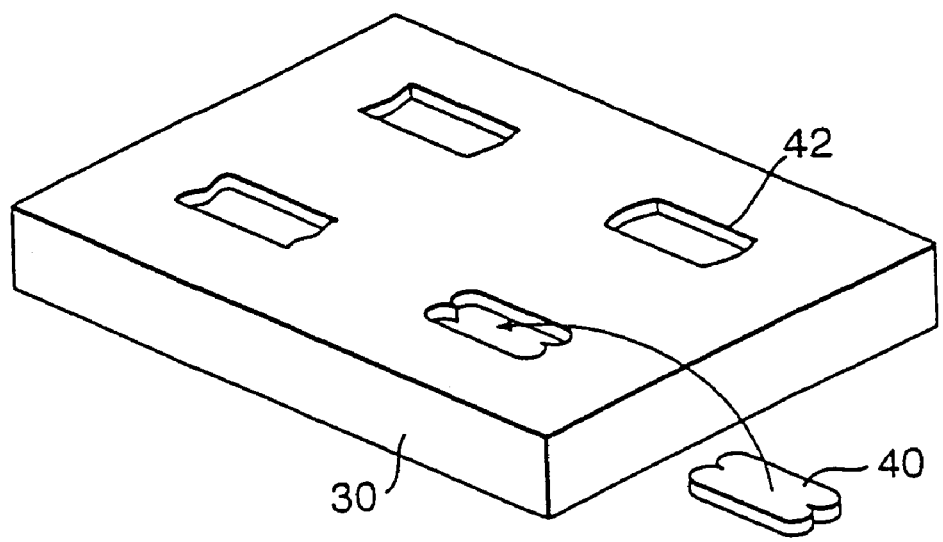
FIG. 7 is a schematic illustration of fluidic self-assembly.

Alternatively, the laser 15 may be used to pattern the substrate 30 such that it is suitable for use in a fluidic self-assembly (FSA) method. FSA separates the production of transistors and other semiconductor devices from the processing of substrates for display devices. Specifically, devices such as single transistors or integrated circuits are first separately produced by conventional techniques, using a single crystal silicon wafer, for example. The wafer is then diced to provide anywhere from hundreds to millions of the devices, the devices comprising blocks 40 ranging in size from ten to several hundred $\mu m^2$. One such block 40 is shown in FIG. 7. Separately, a substrate 30, which may be a flexible plastic substrate, is patterned to provide depressions 42 on the surface thereof, the depressions 42 being shaped to correspond to the shapes of the blocks 40. The blocks 40 are then suspended in a fluid and passed over the substrate 30 having the correspondingly shaped depressions 42 formed thereon. The blocks 40 settle in the depressions 42 and are self-aligning therein. Those blocks 40 that do not settle in the depressions 42 are washed away with the fluid. Finally, the blocks 40 that have self-assembled in the depressions 42 are electrically connected. Where the substrate 30 is a flexible substrate, it has been previously proposed that the reel to reel process be used for connecting the blocks 40.

Accordingly, in the present invention, the laser 15 may be used to pattern the substrate 30 with depressions 42 having a shape corresponding to the shape of the FSA device blocks 40. If a number of different types of device are required to be positioned on the substrate 30, each block 42 is provided with a different shape and correspondingly different shaped depressions 42 are provided on the substrate 30. Thus, only blocks 40 of a particular type can self-assemble in desired locations on the substrate 30. Subsequently, the device blocks 40 suspended in the fluid may be assembled on the patterned substrate 30 and, finally, the print heads 20 may be used to deposit a solution of an electrically conductive material, such as a solution of PEDOT (poly-ethylenedioxythiophene, Baytron P from Bayer AG). The solution dries to form electrical connections for the devices.

Of course, it will be clear to persons skilled in the art that the present invention is suitable for depositing interconnections between isolated circuits, which are provided on a substrate by means other than FSA.

From the foregoing, it will be clear to persons skilled in the art that the present invention can be used to perform large numbers of different processing steps on a flexible substrate and hence to create a wide variety of different devices. Preferably, once the substrate 30 is mounted on the drum 10 all deposition and etching steps can be carried out without removing the substrate from the drum. Thus, the print heads may adapted to eject various different materials as required, including etchants, conductive materials in solution, electroluminescent materials in solution and insulating materials in solution.

Thus, as one example, an organic thin film transistor may be formed by depositing a first material in solution on the flexible substrate; after drying, etching the first material to provide a pattern for the deposition of a second conductive material; depositing the second conductive material in solution on the substrate to form the source and drain of the transistor; removing the first material from the substrate; depositing a semiconductor material over the source and drain, and an insulating material over the semiconductor material; and depositing the second conductive material in solution on the insulating material over the channel between the source and drain to form the gate. Further examples include the provision of one, two, three or more colour electroluminescent materials in each pixel of a display device comprising light emitting diodes and the use of fluidic self assembly to fabricate flexible arrays of thin film transistors and light emitting diodes. Of course, the patterning of TFTs on a substrate using inkjet deposition or FSA using inkjet deposition, both as described above, as well as the inkjet deposition of electroluminescent materials may be performed using the method and apparatus of the present invention in a single process to fabricate a display.

The present invention provides a method of fabricating particularly large scale flexible display devices with improved accuracy, speed and reliability. Indeed, the performance of flexible displays produced in accordance with the present invention, due to the repeatability and uniformity of patterning, is comparable with or better than that of display devices having rigid substrates produced using conventional techniques. However, their speed and cost of production may be substantially lowered. Thus, flexible displays produced in accordance with the present invention may be adhered to transparent rigid sheets in place of prior art display devices having rigid substrates.

In addition, the apparatus of the present invention is less expensive than that of prior art techniques and requires considerably less space. Thus, production costs are significantly reduced. The space-saving effect of the present invention is not due solely to the fact that the diameter of drum 10 is smaller than the width of prior art platens having a comparable surface area. This is particularly apparent when one considers the extra space that would be required if the additional processing capability provided in the present invention were to provided in prior art inkjet printing apparatuses. For example, each of the laser 15, CCD camera 16 and the gas stream would need to be provided in a line running substantially in the direction of reciprocating motion of the print head or heads relative to the substrate. For deposition at the edge of the substrate, when the last of these components is disposed above the edge of the substrate the other devices are disposed some way past the edge of the substrate. Thus, the amount of travel of the components with respect to the substrate would need to be significantly increased so that each component could be disposed over the edge of the substrate at either side. In contrast, the use of a drum in the present invention means that each of the components can be disposed around the circumference of the drum 10, or above or below the drum 10, with no motion of any one of the components past the edge of the drum.

Of course, the print heads 20, CCD camera 16, gas jet 17 and laser 15 may be provided other than on a gantry 4 as shown in FIG. 5. Other means for supporting these components will be apparent to those skilled in the art. Indeed, although it is preferable, the print heads 20 need not even be supported above the drum 10 but could instead be provided at the side of, or even below, the drum 10.

In addition, the drum 10 may be solid or hollow. Thus, the apparatus of the present invention could be adapted to support the substrate on an internal surface of the drum 10, the remaining features of the invention being adapted accordingly. Moreover, the drum 10 need not be cylindrical. As an alternative, the cross section of the drum may be polygonal, for example hexagonal, and a rigid substrate may be mounted on each of the, for example, six sides of the rotatable drum 10. As a further alternative, the drum may have an oval cross-section and, for example, a cam mechanism may be provided to maintain a constant distance and angle between the drum and the print head or heads.

Figure 8:
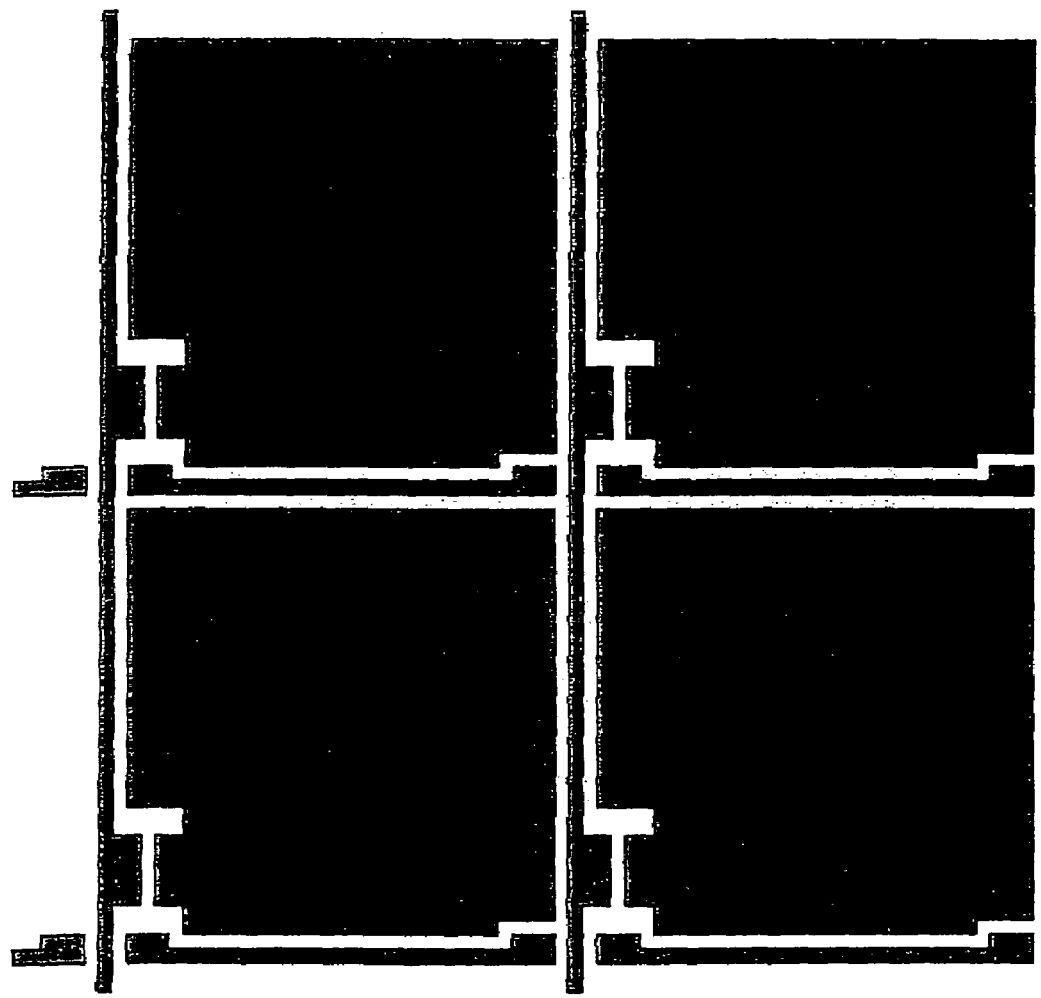
FIG. 8 shows a first example of a patterned substrate for use with the present invention.
Figure 8:
Figure 9:
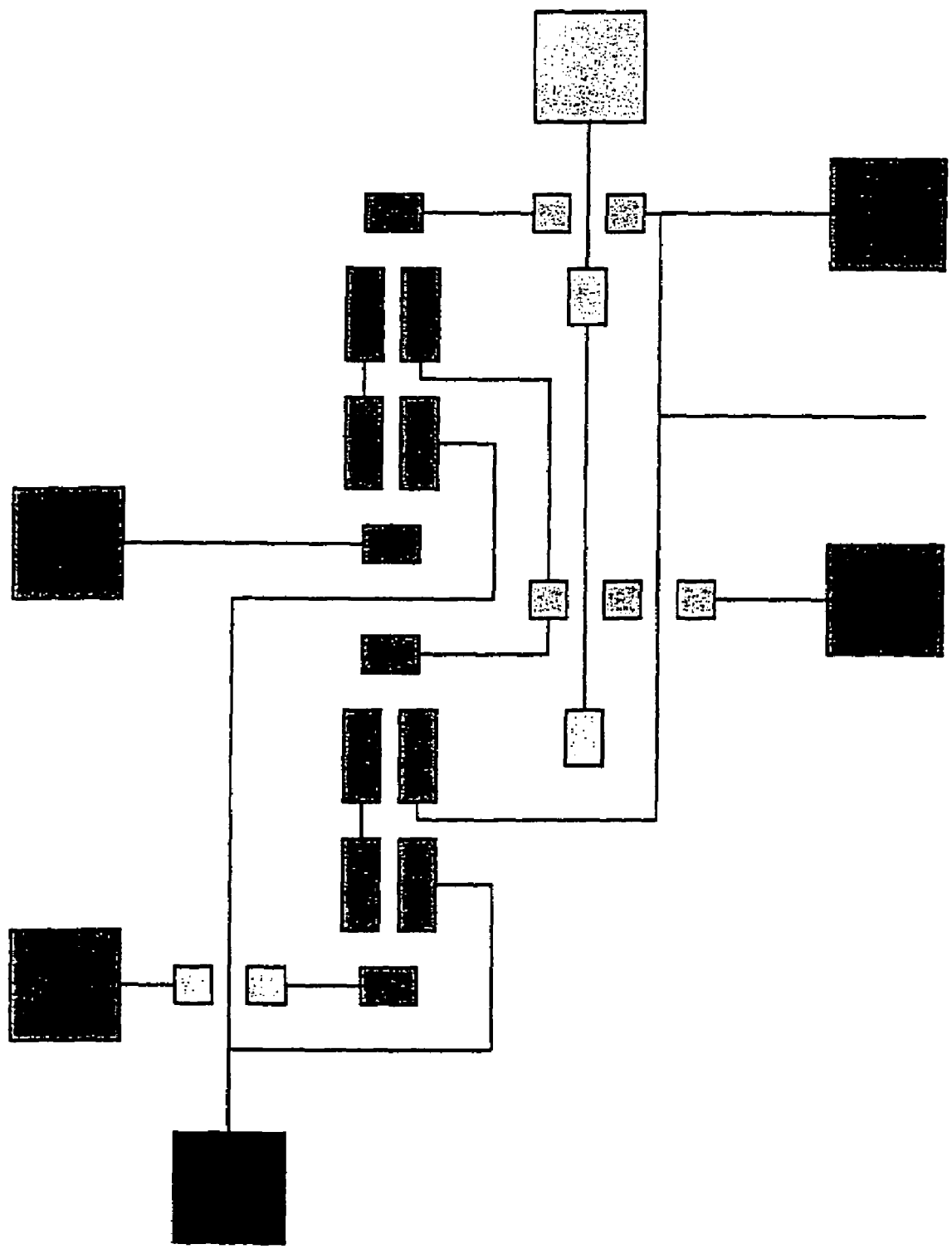
FIG. 9 shows a further example of a patterned substrate for use with the present invention.

The present invention has been described with reference to a patterned substrate supporting a bank structure. However, for certain devices it may be considered advantageous to combine printing using an inkjet technique onto a substrate which has been pre-patterned with conductor lines or electrodes using a lithographic technique. Hence, for example, source and drain electrodes, parts of circuit connections and pixel electrodes may be pre-patterned onto a substrate and semiconductor regions, insulator regions, gate electrodes and certain other parts of circuit interconnections, especially electrode cross-over points which are difficult to provide with a lithographic technique, can be advantageously patterned onto the pre-patterned substrate using an inkjet printing technique in accordance with the present invention. FIGS. 8 and 9 show examples of such pre-patterned substrates.

Figure 10:
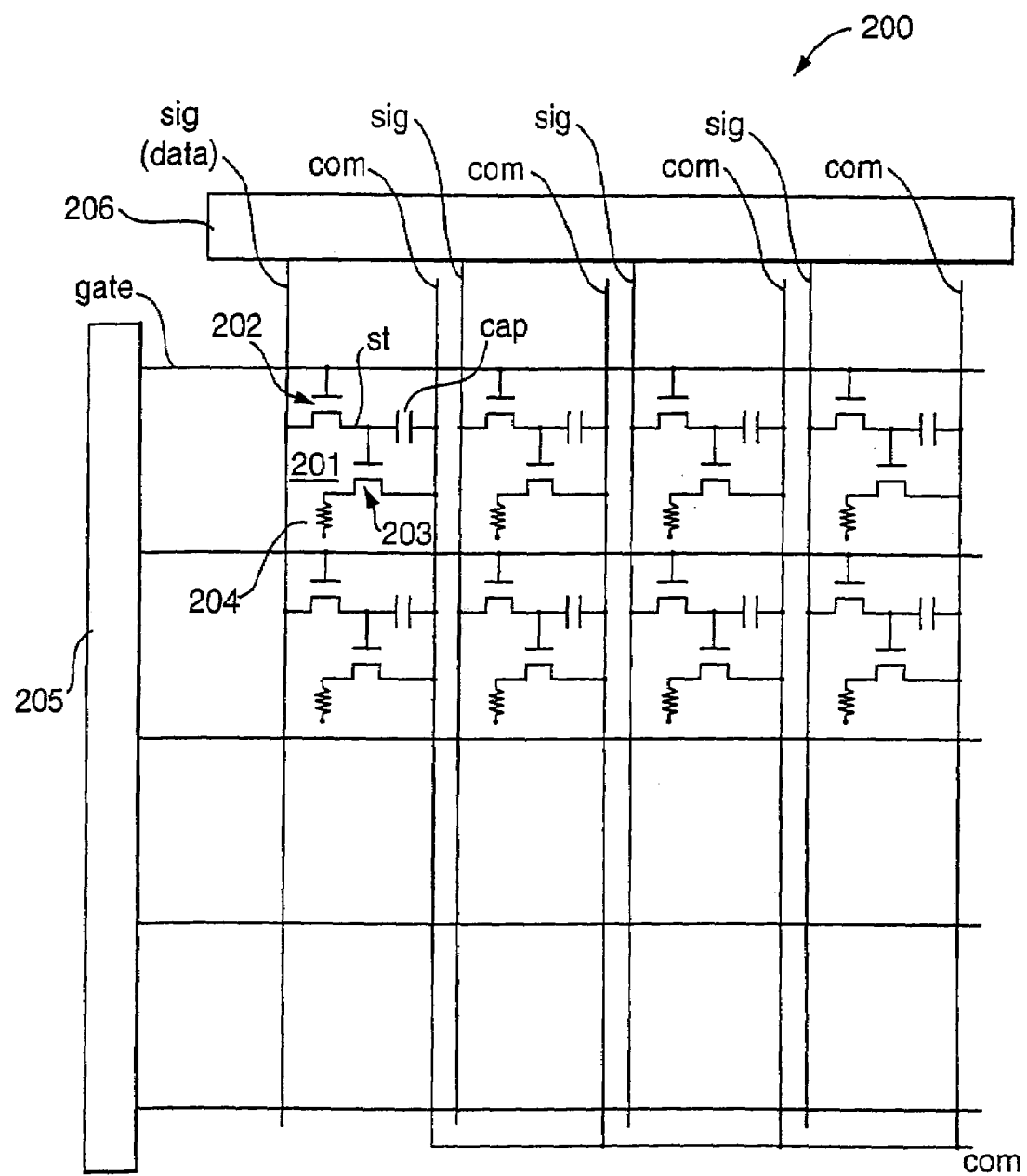
FIG. 10 shows a block diagram of an electro-optic device.

FIG. 10 is a block diagram illustrating an active matrix type display device (or apparatus) incorporating electro-optical elements, such as organic electroluminescent elements as a preferred example of the electro-optical devices, and an addressing scheme which may be fabricated using the method or apparatus of the present invention. In the display device 200 shown in this figure, a plurality of scanning lines "gate", a plurality of data lines "sig" extending in a direction that intersects the direction in which the scanning lines "gate" extend, a plurality of common power supply lines "corn" extending substantially parallel to the data lines "sig", and a plurality of pixels 201 located at the intersections of the data lines "sig" and the scanning lines "gate" which are formed above a substrate.

Each pixel 201 comprises a first TFT 202, to which a scanning signal is supplied to the gate electrode through the scanning gate, a holding capacitor "cap" which holds an image signal supplied from the data line "sig" via the first TFT 202, a second TFT 203 in which the image signal held by the holding capacitor "cap" is supplied to the gate electrode (a second gate electrode), and an electro-optical element 204 such as an electroluminescent element (indicated as a resistance) into which the driving current flows from the common power supply line "com" when the element 204 is electrically connected to the common power supply line "com" through the second TFT 203. The scanning lines "gate" are connected to a first driver circuit 205 and the data lines "sig" are connected to a second driver circuit 206. At least one of the first circuit 205 and the second circuit 205 can be preferably formed above the substrate above which the first TFTs 202 and the second TFTs 203 are formed. The TFT array(s) manufactured by the methods according to the present invention can be preferably applied to at least one of an array of the first TFTs 202 and the second TFTs 203, the first driver circuit 205, and the second driver circuit 206.

The present invention may therefore be used to fabricate displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electro-optical device or display to which the TFT array(s) manufactured by the methods according to the present invention is (are) applied as noted above can be incorporated in the many types of equipment, as exemplified above.

Various electronic apparatuses using electro-optical display devices fabricated in accordance with the present invention will now be described.

<1: Mobile Computer>

An example in which the display device fabricated in accordance with one of the above embodiments is applied to a mobile personal computer will now be described.

FIG. 11 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the patterning method of the present invention, as described above.

<2: Portable Phone>

Next, an example in which the display device is applied to a display section of a portable phone will be described. FIG. 12 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device fabricated in accordance with the method of the present invention, as described above.

<3: Digital Still Camera>

Next, a digital still camera using an OEL display device as a finder will be described. FIG. 13 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 11, the portable phone shown in FIG. 12, and the digital still camera shown in FIG. 13, include OEL element television sets, view-finder-type and monitoring-type video tape recorders, vehicle navigation and instrumentation systems, pagers, electronic notebooks, portable calculators, word processors, workstations, TV telephones, point-of-sales system (POS) terminals, and devices provided with touch panels. Of course, OEL devices fabricated using the method of the present invention can be applied not only to display sections of these electronic apparatuses but also to any other form of apparatus which incorporates a display section.

Furthermore, the display devices fabricated in accordance with the method of the present invention are also suitable for a screen-type large area television which is very thin, flexible and light in weight. It is possible therefore to paste or hang such large area television on a wall. The flexible television can, if required, be conveniently rolled up when it is not used.

Printed circuit boards may also be fabricated using the technique of the present invention. Conventional printed circuit boards are fabricated by photolithographic and etching techniques, which increase the manufacturing cost, even though they are a more cost-oriented device than other microelectronics devices, such as IC chips or passive devices. High-resolution patterning is also required to achieve high-density packaging. High-resolution interconnections on a board can be easily and reliably be achieved using the present invention.

Colour filters for colour display applications may also be provided using the present invention. Droplets of liquid containing dye or pigment are deposited accurately onto selected regions of a substrate. A matrix format is frequently used with the droplets in extremely close proximity to each other. In situ viewing can therefore prove to be extremely advantageous. After drying, the dye or pigments in the droplets act as filter layers.

DNA sensor array chips may also be provided using the present invention. Solutions containing different DNAs are deposited onto an array of receiving sites separated by small gaps as provided by the chips.

The aforegoing description has been given by way of example only and it will be appreciated by a person skilled in the art that many further modifications can be made without departing from the scope of the present invention.

The invention claimed is:

1. A method of fabricating an optical, electro-optical, electronic or sensor device, the method comprising:
   mounting a substrate including dewetting areas on a drum such that the substrate wraps around the drum; and
   forming a plurality of films that are separated by the dewetting areas, the forming of the plurality of films including discharge of liquid droplets toward the substrate,
   the drum rotating during at least a part of a period in which the discharging of the droplets is carried out.

2. A method according to claim 1, wherein an inkjet print head is used for to discharge the liquid droplets as a series toward the substrate.

3. A method according to claim 2, wherein the series of droplets is discharge toward the substrate during a revolution of the drum and the print head remains stationary during discharging of the series of droplets.

4. A method according to claim 3, wherein, after discharging the series of droplets:
   the print head is moved stepwise relative to the drum, in a direction substantially parallel to a longitudinal axis of the drum; and
   a subsequent series of droplets is discharged toward the substrate during a subsequent revolution of the drum.

5. A method according to claim 4, wherein the series of droplets is discharged toward the substrate during a revolution of the drum and the print head is moved continuously relative to the drum in a direction substantially parallel to a longitudinal axis of the drum during discharging of the series of droplets.

6. A method according to claim 2, wherein the print head comprises a plurality of nozzles and a respective plurality of series of droplets is discharged during a revolution of the drum.

7. A method according to claim 6, wherein
   a plurality of first series of droplets is discharged during a revolution of the drum;
   the print head is moved relative to the substrate in a direction substantially parallel to a longitudinal axis of the drum; and
   a plurality of second series of droplets is discharged toward the substrate during a subsequent revolution of the drum such that at least one of the second series of droplets is interleaved with the plurality of first series of droplets.

8. A method according to claim 6 wherein at least one of the nozzles discharges a different liquid from another of the nozzles.

9. A method according to claim 8, wherein said at least one nozzle discharges the different liquid at the same location toward the substrate as said another of the nozzles.

10. A method according to claim 2, wherein said discharging is also performed using a second inkjet print head for discharging the same or a second liquid.

11. A method according to claim 1, wherein a motor is used for rotating the drum and a position feedback system generates signals for controlling the motor.

12. A method according to claim 11, wherein the signals generated by the position feedback system are used for controlling a timing of discharging of the droplets.

13. A method according to claim 1, wherein the substrate is mounted on the drum by suction.

14. A method according to claim 13, wherein said suction is provided via a plurality of apertures provided on a surface of the drum on which the substrate is mounted.

15. A method according to claim 1, wherein the drum is polygonal in cross section such that it comprises a plurality of substantially planar surfaces parallel to the longitudinal axis of the drum.

16. A method according to claim 15, wherein a substantially rigid substrate is mounted on at least one of said plurality of surfaces.

17. A method according to claim 1, wherein the drum is selected to be substantially ovoid in cross-section.

18. A method according to claim 1, wherein the drum is selected to be substantially cylindrical.

19. A method according to claim 18, wherein the substrate is selected to comprise a flexible substrate and is mounted contiguous with the curved surface of the drum.

20. A method according to claim 19, wherein the flexible substrate is selected to comprise one of a substantially rectangular and a substantially square substrate and is mounted on the drum so that opposite edges thereof are substantially parallel with each other and with the longitudinal axis of the drum.

21. A method according to claim 20, wherein the flexible substrate is mounted on the drum so that the substrate encompasses a circumference of the drum such that said opposite edges thereof are mutually contiguous.

22. A method according to claim 19, wherein the flexible substrate is selected to comprise one of a substantially rectangular and a substantially square substrate and is mounted on the drum so that opposite edges thereof are substantially parallel with each other but at an angle to the longitudinal axis of the drum.

23. A method according to claim 22, wherein the flexible substrate is mounted on the drum so that the substrate encompasses a circumference of the drum such that said opposite edges thereof are mutually contiguous.

24. A method according to claim 1, wherein the substrate is mounted on an internal surface of the drum.

25. A method according to claim 1 further comprising heating the drum.

26. A method according to claim 25, wherein said heating is provided by a plurality of heating filaments provided adjacent to a surface of the drum on which the substrate is mounted.

27. A method according to claim 1 further comprising laser patterning the substrate when the drum rotates.

28. A method according to claim 1 further comprising providing a stream of gas for drying the liquid deposited on the substrate.

29. A method according to claim 28, wherein the gas is nitrogen or an inert gas.

30. A method according to claim 1, further comprising providing an array of alignment marks on the drum and a corresponding array of alignment marks on the substrate and viewing the arrays of alignment marks on the drum and substrate respectively for detecting the position of the substrate on the drum.

31. A method according to claim 30, further comprising, in the event that a viewed alignment mark on the substrate is not aligned with an alignment mark on the drum, controlling subsequent deposition of soluble material such that droplets of the liquid are discharged at a correct location on the substrate.

32. A method according to claim 30, further comprising aligning the alignment marks on the substrate with the respective alignment marks on the drum.

33. A method according to claim 30, further comprising using a charge coupled device for said viewing.

34. A method according to claim 1, further comprising providing an array of alignment marks on the substrate, wherein the liquid is discharged toward the substrate substantially aligned with one of the alignment marks thereby to provide an alignment dot of the liquid, and viewing the alignment dot.

35. A method according to claim 34, further comprising, in an event that a viewed alignment dot is not aligned with an alignment mark on the substrate, controlling subsequent deposition of the liquid such that it discharged substantially aligned with one of the alignment marks on the substrate.

36. A method according to claim 1, further comprising providing an array of alignment marks on the substrate, wherein the liquid is discharged toward a first surface of the substrate substantially aligned with one of the alignment marks thereby to provide an alignment dot of the liquid in a wet condition, and viewing the alignment dot through a further surface of the substrate opposite to the first surface prior to the discharged alignment dot of the liquid changing from the wet condition to a dry condition.

37. A method according to claim 36, further comprising, in an event that a viewed alignment dot is not aligned with an alignment mark on the substrate, controlling subsequent deposition of the liquid such that the liquid is discharged substantially aligned with one of the alignments marks on the substrate.

38. A method according to claim 1, wherein the liquid is selected to be suitable for etching the substrate.

39. A method according to claim 1, wherein the liquid is selected to comprise a solvent for a material disposed on the substrate.

40. A method according to claim 1, wherein the liquid selected to comprise is a solution comprising a soluble material and a solvent.

41. A method according to claim 40, wherein the soluble material is selected to comprise a conductive material.

42. A method according to claim 41, wherein the conductive material is selected to comprise PEDOT.

43. A method according to claim 40, wherein the soluble material is selected to comprise an electroluminescent material.

44. A method according to claim 40, wherein the soluble material is selected to comprise an electrically insulating material.

45. A method according to claim 1, wherein the electronic devices comprise organic semiconducting polymers discharged in solution on the substrate.

46. A method according to claim 1, wherein the electronic devices comprise organic polymer light emitting diodes.

47. A method according to claim 1, wherein the electronic devices comprise organic polymer thin film transistors.

48. A method according to claim 1, wherein said method is a method for discharging interconnections for self assembled chips of the electro-optical, electronic or sensor device.

49. A method according to claim 1, the substrate including a second pre-pattern of a plurality of electrodes.

50. A method according to claim 1, the dewetting area being formed of walls.

51. A method of fabricating an optical, electro-optical, electronic or sensor device, the method comprising:
mounting a substrate including a first pre-pattern of wall structures to a drum such that the substrate wraps around the drum; and
forming a plurality of films that are separated by the wall structures, the forming of the plurality of films including discharge of liquid droplets toward the substrate, the drum rotating during at least a part of a period in which the discharging of the droplets is carried out.

52. A method according to claim 2, wherein an inkjet print head is used to discharge the liquid droplets as a series toward the substrate.

53. A method according to claim 52, wherein the series of droplets is discharged toward the substrate during a revolution of the drum and the print head remains stationary during discharging of the series of droplets.

54. A method according to claim 53, wherein, after discharging the series of droplets:
the print head is moved stepwise relative to the drum, in a direction substantially parallel to a longitudinal axis of the drum; and
a subsequent series of droplets is discharged toward the substrate during a subsequent revolution of the drum.

55. A method according to claim 52, wherein the series of droplets is discharged toward the substrate during a revolution of the drum and the print head is moved continuously relative to the drum in a direction substantially parallel to a longitudinal axis of the drum during discharging of the series of droplets.

56. A method according to claim 52, wherein the print head comprises a plurality of nozzles and a respective plurality of series of droplets is discharged during a revolution of the drum.

57. A method according to claim 56, wherein
a plurality of first series of droplets is discharged during a revolution of the drum;
the print head is moved relative to the substrate in a direction substantially parallel to a longitudinal axis of the drum; and
a plurality of second series of droplets is discharged toward the substrate during a subsequent revolution of the drum such that at least one of the second series of droplets is interleaved with the plurality of first series of droplets.

58. A method according to claim 56, wherein at least one of the nozzles discharges a different liquid from another of the nozzles.

59. A method according to claim 58, wherein said at least one nozzle discharges the different liquid at the same location toward the substrate as said another of the nozzles.

60. A method according to claim 52, wherein said discharging is also performed using a second inkjet print head for discharging the same or a second liquid.

61. A method according to claim 2, wherein a motor is used for rotating the drum and a position feedback system generates signals for controlling the motor.

62. A method according to claim 61, wherein the signals generated by the position feedback system are used for controlling a timing of discharging of the droplets.

63. A method according to claim 2, wherein the substrate is mounted on the drum by suction.

64. A method according to claim 63, wherein said suction is provided via a plurality of apertures provided on a surface of the drum on which the substrate is mounted.

65. A method according to claim 2, wherein the drum is polygonal in cross section such that it comprises a plurality of substantially planar surfaces parallel to the longitudinal axis of the drum.

66. A method according to claim 65, wherein a substantially rigid substrate is mounted on at least one of said plurality of surfaces.

67. A method according to claim 2, wherein the drum is selected to be substantially ovoid in cross-section.

68. A method according to claim 2, wherein the drum is selected to be substantially cylindrical.

69. A method according to claim 68, wherein the substrate is selected to comprise a flexible substrate and is mounted contiguous with the curved surface of the drum.

70. A method according to claim 69, wherein the flexible substrate is selected to comprise one of a substantially rectangular and a substantially square substrate and is mounted on the drum so that opposite edges thereof are substantially parallel with each other and with the longitudinal axis of the drum.

71. A method according to claim 70, wherein the flexible substrate is mounted on the drum so that the substrate encompasses a circumference of the drum such that opposite edges thereof are mutually contiguous.

72. A method according to claim 69, wherein the flexible substrate is selected to comprise one of a substantially rectangular and a substantially square substrate and is mounted on the drum so that opposite edges thereof are substantially parallel with each other but at an angle to the longitudinal axis of the drum.

73. A method according to claim 71, wherein the flexible substrate is mounted on the drum so that the substrate encompasses a circumference of the drum such that said opposite edges thereof are mutually contiguous.

74. A method according to claim 2, wherein the substrate is mounted on an internal surface of the drum.

75. A method according to claim 2, further comprising heating the drum.

76. A method according to claim 75, wherein said heating is provided by a plurality of heating filaments provided adjacent to a surface of the drum on which the substrate is mounted.

77. A method according to claim 2, further comprising laser patterning the substrate when the drum rotates.

78. A method according to claim 2, further comprising providing a stream of gas for drying the liquid discharged on the substrate.

79. A method according to claim 78, wherein the gas is nitrogen or an inert gas.

80. A method according to claim 2, further comprising providing an array of alignment marks on the drum and a corresponding array of alignment marks on the substrate and viewing the arrays of alignment marks on the drum and substrate respectively for detecting the position of the substrate on the drum.

81. A method according to claim 80, further comprising, in the event that a viewed alignment mark on the substrate is not aligned with an alignment mark on the drum, controlling subsequent deposition of soluble material such that droplets of the liquid are discharged at a correct location on the substrate.

82. A method according to claim 80, further comprising aligning the alignment marks on the substrate with the respective alignment marks on the drum.

83. A method according to claim 80, further comprising using a charge coupled device for said viewing.

84. A method according to claim 2, further comprising providing an array of alignment marks on the substrate, wherein the liquid is discharged toward the substrate substantially aligned with one of the alignment marks thereby to provide an alignment dot of the liquid, and viewing the alignment dot.

85. A method according to claim 84, further comprising, in an event that a viewed alignment dot is not aligned with an alignment mark on the substrate, controlling subsequent deposition of the liquid such that it is discharged substantially aligned with one of the alignment marks on the substrate.

86. A method according to claim 2, further comprising providing an array of alignment marks on the substrate, wherein the liquid is discharged toward a first surface of the substrate substantially aligned with one of the alignment marks thereby to provide an alignment dot of the liquid in a wet condition, and viewing the alignment dot through a further surface of the substrate opposite to the first surface prior to the discharged alignment dot of the liquid changing from the wet condition to a dry condition.

87. A method according to claim 2, wherein the liquid is selected to be suitable for etching the substrate.

88. A method according to claim 2, wherein the liquid is selected to comprise a solvent for a material disposed on the substrate.

89. A method according to claim 2, wherein the liquid selected to comprise is a solution comprising a soluble material and a solvent.

90. A method according to claim 89, wherein the soluble material is selected to comprise a conductive material.

91. A method according to claim 90, wherein the conductive material is selected to comprise PEDOT.

92. A method according to claim 89, wherein the soluble material is selected to comprise an electroluminescent material.

93. A method according to claim 89, wherein the soluble material is selected to comprise an electrically insulating material.

94. A method according to claim 2, wherein the electronic devices comprise organic semiconducting polymers discharged in solution on the substrate.

95. A method according to claim 2, wherein the electronic devices comprise organic polymer light emitting diodes.

96. A method according to claim 2, wherein the electronic devices comprise organic polymer thin film transistors.

97. A method according to claim 2, wherein said method is a method for discharging interconnections for self assembled chips of the electro-optical, electronic or sensor device.

98. A method according to claim 2, the substrate including a second pre-pattern of a plurality of electrodes.

99. An optical, electro-optical, electronic or sensor device fabrication apparatus comprising:

a drum;
mounting means for mounting a substrate on and stationary relative to the drum;
rotating means for rotating the drum about a longitudinal axis of the drum; and
discharging means for discharging liquid droplets toward the substrate when the drum rotates; and
a plurality of heating filaments provided adjacent to a surface of the drum on which the substrate in mounted.

100. An apparatus according to claim 99, further comprising means for laser patterning the substrate when the drum rotates.

101. An apparatus according to claim 99, further comprising means for providing a stream of gas for drying the liquid discharged on the substrate.

102. An apparatus according to claim 101, wherein the gas is nitrogen or an inert gas.

103. An apparatus according to claim 99, further comprising means for determining whether the liquid is discharged substantially aligned with one of a plurality of alignment marks provided on the substrate.

104. An apparatus according to claim 103, further comprising means for controlling subsequent deposition of the liquid such that it is discharged substantially aligned with one of the plurality of alignment marks, in the event that it is determined that the liquid was not previously discharged substantially aligned with one of the plurality of alignment marks.

105. An apparatus according to claim 103, wherein said means for determining comprises a charge coupled device.

106. An apparatus according to claim 99, wherein a plurality of alignment marks is provided on the drum and further comprising means for determining whether the plurality of alignment marks on the drum are substantially aligned with a respective plurality of alignment marks provided on the substrate.

107. An apparatus according to claim 99, wherein said apparatus is adapted for fabricating electronic devices on the substrate.

108. An apparatus according to claim 99, further comprising means for depositing fluidic self assembly chips on the substrate.

* * * * *